United States Patent
Oki et al.

(10) Patent No.: US 10,544,518 B2
(45) Date of Patent: Jan. 28, 2020

(54) CHAMBER COMPONENTS FOR EPITAXIAL GROWTH APPARATUS

(71) Applicant: Applied Materials, Inc., Santa Clara, CA (US)

(72) Inventors: Shinichi Oki, Chiba-Ken (JP); Yoshinobu Mori, Ohmura (JP)

(73) Assignee: APPLIED MATERIALS, INC., Santa Clara, CA (US)

( * ) Notice: Subject to any disclaimer, the term of this patent is extended or adjusted under 35 U.S.C. 154(b) by 728 days.

(21) Appl. No.: 15/077,354

(22) Filed: Mar. 22, 2016

(65) Prior Publication Data

US 2016/0281261 A1    Sep. 29, 2016

Related U.S. Application Data

(60) Provisional application No. 62/138,365, filed on Mar. 25, 2015.

(51) Int. Cl.
*C30B 25/08* (2006.01)
*C23C 16/458* (2006.01)
(Continued)

(52) U.S. Cl.
CPC .......... *C30B 25/08* (2013.01); *C23C 16/4558* (2013.01); *C23C 16/4581* (2013.01);
(Continued)

(58) Field of Classification Search
CPC .......... C23C 16/4412; C23C 16/45517; C23C 16/45551; C23C 16/45561;
(Continued)

(56) References Cited

U.S. PATENT DOCUMENTS 5,914,050 A * 6/1999 Comita ............... C23C 16/4405
                                                                118/715
6,444,027 B1    9/2002 Yang et al.
(Continued)

FOREIGN PATENT DOCUMENTS

CN    205741209 U    11/2016
CN    205856605 U    1/2017
(Continued)

OTHER PUBLICATIONS

Notice of Rectification from Chinese Patent Application Serial No. 201620241726.9 dated Jun. 24, 2016.
(Continued)

*Primary Examiner* — Jeffrie R Lund
*Assistant Examiner* — Stanislav Antolin
(74) *Attorney, Agent, or Firm* — Patterson + Sheridan LLP

(57) ABSTRACT

Chamber components for an epitaxial growth apparatus are disclosed. A reaction chamber defined and formed by a ceiling plate. A reactant gas is rectified in a reactant gas supply path disposed in the side wall, so that a horizontal component in a flow direction of the reactant gas in the reaction chamber corresponds to a horizontal component in a direction extending from the center of an opening of the reactant gas supply path. Improvements to the upper side wall, susceptor and rectification plate of the epitaxial growth apparatus have resulted in improvements to the uniformity and formation speed of the epitaxial layer formed on substrates resulting in higher throughput and lower defects.

11 Claims, 30 Drawing Sheets

(51) Int. Cl.
*C30B 25/12* (2006.01)
*H01L 21/687* (2006.01)
*C23C 16/455* (2006.01)
*C30B 25/14* (2006.01)
*F24C 15/10* (2006.01)
*H01L 21/02* (2006.01)

(52) U.S. Cl.
CPC ........ *C23C 16/45565* (2013.01); *C30B 25/12* (2013.01); *C30B 25/14* (2013.01); *F24C 15/10* (2013.01); *H01L 21/68785* (2013.01); *H01L 21/02532* (2013.01)

(58) Field of Classification Search
CPC ........ C23C 16/45563; C23C 16/45565; C23C 16/45572; C23C 16/45574; C23C 16/4558; C23C 16/45587; C23C 16/45591; C23C 16/4581; C23C 16/4585; C23C 16/481; C30B 25/02–22; C30B 25/08; C30B 25/14; C30B 25/16–165; C30B 29/06; F24C 15/10; H01J 37/32431; H01J 37/3244–32449; H01J 37/32798–32807; H01L 21/02532; H01L 21/0262; H01L 21/68735; H01L 21/68742; H01L 21/68785
See application file for complete search history.

(56) References Cited

U.S. PATENT DOCUMENTS

| | | | |
|---|---|---|---|
| 6,652,650 B2 | | 11/2003 | Yang et al. |
| D693,782 S * | | 11/2013 | Mori ................. C23C 16/45504 D13/182 |
| 2003/0015141 A1 * | | 1/2003 | Takagi ................ C23C 16/4585 118/728 |
| 2005/0000449 A1 | | 1/2005 | Ishibashi et al. |
| 2006/0266852 A1 | | 11/2006 | Choi |
| 2007/0107653 A1 * | | 5/2007 | Yamada ................. C23C 16/455 117/84 |
| 2007/0281084 A1 * | | 12/2007 | Hirosawa .......... C23C 16/45565 427/248.1 |
| 2008/0066684 A1 | | 3/2008 | Patalay et al. |
| 2011/0121503 A1 * | | 5/2011 | Burrows ............. C23C 16/4412 269/289 R |
| 2012/0240853 A1 * | | 9/2012 | Carlson ............... C23C 16/4404 118/715 |
| 2013/0180446 A1 | | 7/2013 | Kang et al. |
| 2013/0200170 A1 * | | 8/2013 | Marx ................ H01J 37/32871 239/1 |
| 2014/0116340 A1 * | | 5/2014 | Mori ................. C23C 16/45502 118/725 |
| 2014/0224174 A1 * | | 8/2014 | Abedijaberi ...... C23C 16/45504 118/715 |
| 2014/0261159 A1 * | | 9/2014 | Okabe .................... C30B 25/12 117/98 |
| 2014/0290573 A1 * | | 10/2014 | Okabe ............... H01L 21/02617 118/500 |
| 2016/0068997 A1 * | | 3/2016 | Lau ......................... C30B 25/14 239/132 |
| 2016/0281261 A1 * | | 9/2016 | Oki .......................... C30B 25/08 |
| 2016/0281262 A1 * | | 9/2016 | Oki .......................... C30B 25/08 |
| 2016/0281263 A1 * | | 9/2016 | Oki .......................... C30B 25/08 |

FOREIGN PATENT DOCUMENTS

| | | | | |
|---|---|---|---|---|
| EP | 1289006 A1 | | 3/2003 | |
| JP | 10256163 A | * | 9/1998 | ....... C23C 16/45502 |
| JP | H10256163 A | | 9/1998 | |
| JP | 2000124135 A | * | 4/2000 | ....... C23C 16/45502 |
| JP | 2000124135 A | | 4/2000 | |
| JP | 2003115459 A | | 4/2003 | |
| JP | 2007324285 A | * | 12/2007 | |
| JP | 5343162 B1 | * | 11/2013 | ....... C23C 16/45502 |
| JP | 5386046 B1 | * | 1/2014 | ....... H01L 21/02617 |
| JP | 2014086688 A | * | 5/2014 | ....... C23C 16/45502 |
| JP | 2014179581 A | | 9/2014 | |
| JP | 2015043387 A | * | 3/2015 | ....... H01L 21/02617 |
| JP | 2015043387 A | | 3/2015 | |
| KR | 101487411 B1 | | 1/2015 | |
| KR | 101487411 B1 | * | 1/2015 | |
| TW | M305960 U | | 2/2007 | |
| TW | 201347035 A | | 11/2013 | |
| TW | 201501233 A | | 1/2015 | |
| TW | M535866 U | | 1/2017 | |
| WO | WO-2014151867 A1 | * | 9/2014 | ............. C30B 25/12 |

OTHER PUBLICATIONS

Written Opinion and International Search Report from PCT/US2016/023263 dated Jun. 24, 2016.
Search Report from European Patent Application No. 16769448.8 dated Nov. 8, 2018.
Chinese Office Action for Application No. 201610180026.8 dated Feb. 19, 2019.
Office Action for Taiwan Patent Application No. 105109495 dated Feb. 19, 2019.
Chinese Office Action for Application No. 201610179467.6 dated Mar. 4, 2019.
Taiwan Office Action for Application No. 105109502 dated Apr. 24, 2019.
Taiwan Office Action for Application No. 105109498 dated Apr. 24, 2019.

* cited by examiner

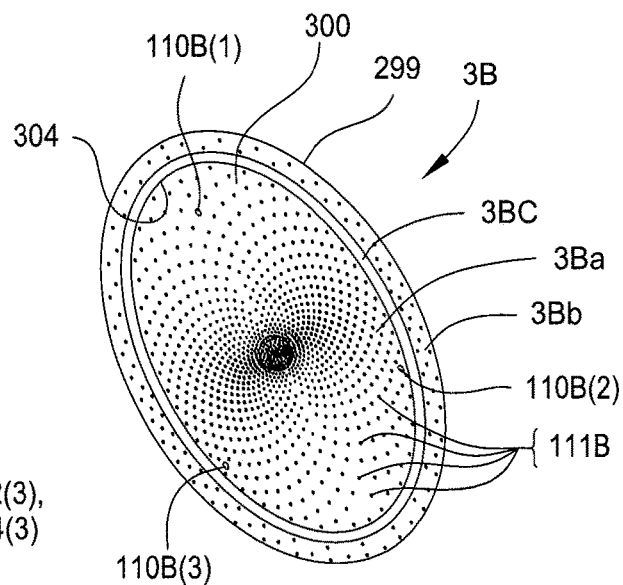
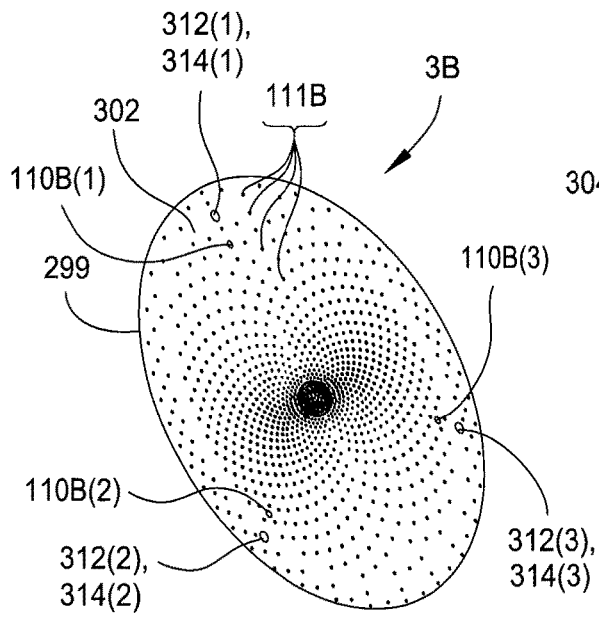
Fig. 12B        Fig. 12A
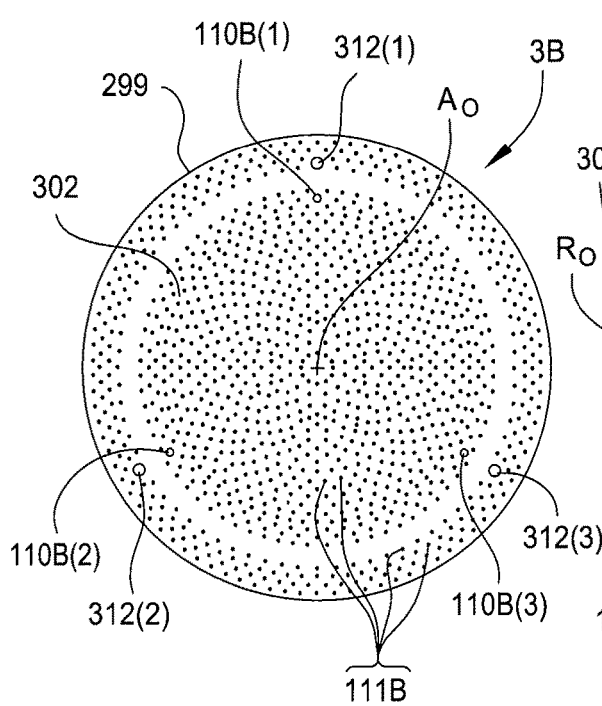
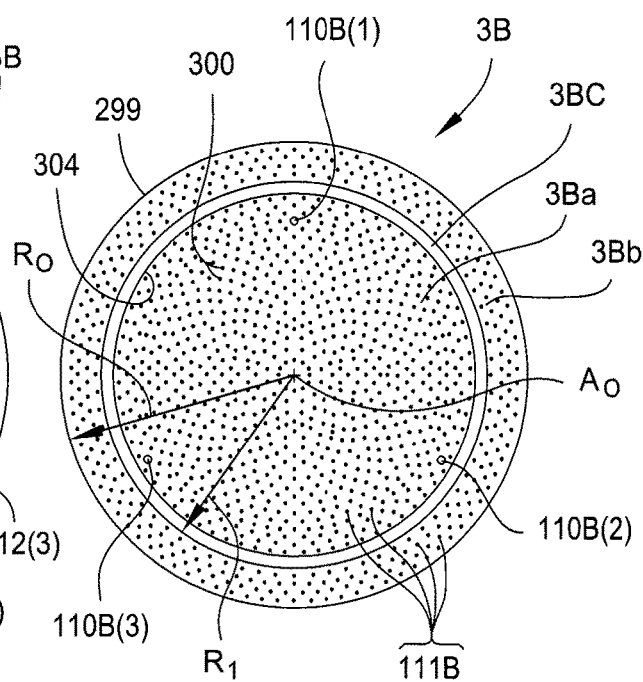
Fig. 12D        Fig. 12C

CHAMBER COMPONENTS FOR EPITAXIAL GROWTH APPARATUS

CROSS REFERENCE TO RELATED APPLICATIONS

This application claims priority from U.S. Provisional Application Ser. No. 62/138,365, filed Mar. 25, 2015, which is hereby incorporated by reference in its entirety.

FIELD OF THE DISCLOSURE

The present disclosure relates to a film forming method using epitaxial growth and an epitaxial growth apparatus, and more specifically to chamber components for such epitaxial growth apparatus that enable the method.

BACKGROUND

At present, as an epitaxial growth apparatus for causing an epitaxial film to grow, on a substrate using epitaxial growth, an apparatus including a process chamber and a rotatable substrate support disposed in the process chamber and configured to rotate a substrate about a rotation axis is known in which a reactant gas is introduced to the substrate in a direction parallel to the substrate to form a film on the substrate on the substrate support.

In such an epitaxial growth apparatus, there is currently a need for an increase in growth rate. However, it is not preferable that a large amount of source gas is included in the reactant gas so as to further increase the growth rate, for example, because an increase in the film formation cost or an increase in the number of particles is caused.

In epitaxial growth, when the thickness of a boundary layer (at a position at which the flow rate is 99% of the flow rate of the main stream of the reactant gas flow) on the surface of a substrate decreases, it is known that an increase in growth rate is expected. On the other hand, when the thickness of the boundary layer simply decreases, a flow in which the reactant gas escapes toward the circumferential edge of the substrate on the surface of the substrate is formed and it is thus difficult to adjust a film thickness distribution or a resistivity distribution.

SUMMARY OF THE DISCLOSURE

In one embodiment, an upper side wall for an epitaxial growth apparatus is disclosed herein. The upper side wall includes a body. The body includes an upper surface, a bottom surface, and a first and second convex portions. The upper surface has an annular shape configured to form an abutment with a ceiling plate. The annular shape is disposed about a center axis. The bottom surface includes abutment surface and flow guiding surface. The abutment surfaces are configured to form an abutment with a lower side wall supporting the upper side wall. The flow guiding surfaces are configured to direct precursor gases to and from a substrate. The first and second convex portions each extend from the bottom surface. The flow guiding surfaces are disposed between the first and second convex portions.

In another embodiment, a rectification plate is disclosed herein. The rectification plate includes an elongated body, a plurality of through holes, and fastener holes. The elongated body includes a first surface and a second surface. The second surface is opposite the first surface. The plurality of through holes extends from the first surface to the second surface. The plurality of through holes is allocated into at least three groups. The fastener holes are disposed between adjacent through holes of the at least three groups. The fastener holes extend from the first surface to the second surface.

In another embodiment, a susceptor for supporting a substrate within an epitaxial growth apparatus is disclosed herein. The susceptor includes an annular body and a plurality of through holes. The annular body extends to an outer radius from a center axis. The annular body includes a top surface and a bottom surface opposite the top surface. The top surface includes a concave portion, a non-concave portion, and a transition portion. The concave portion is disposed at the center axis and extending to an inner radius. The non-concave portion is disposed along the circumference of the annular body. The transition portion connects the concave portion to the non-concave portion. The transition portion is configured to form an abutment with the substrate and support the substrate. The transition portion is at a higher elevation than the non-concave portion when the top surface is facing upward and the center axis is disposed vertically. The plurality of through holes extends from the top surface to the bottom surface. The plurality of through holes is positioned within the concave portion and the non-concave portion. The density of the plurality of through holes in the concave portion and the non-concave portion is at least 5.0 through holes per square centimeters.

BRIEF DESCRIPTION OF THE DRAWINGS

FIGS. 12A through 12J are a top perspective view, a bottom perspective view, a top view, and a bottom view, respectively, of another embodiment of the susceptor of FIG. 11.

DETAILED DESCRIPTION OF THE DISCLOSURE

Figure 1:
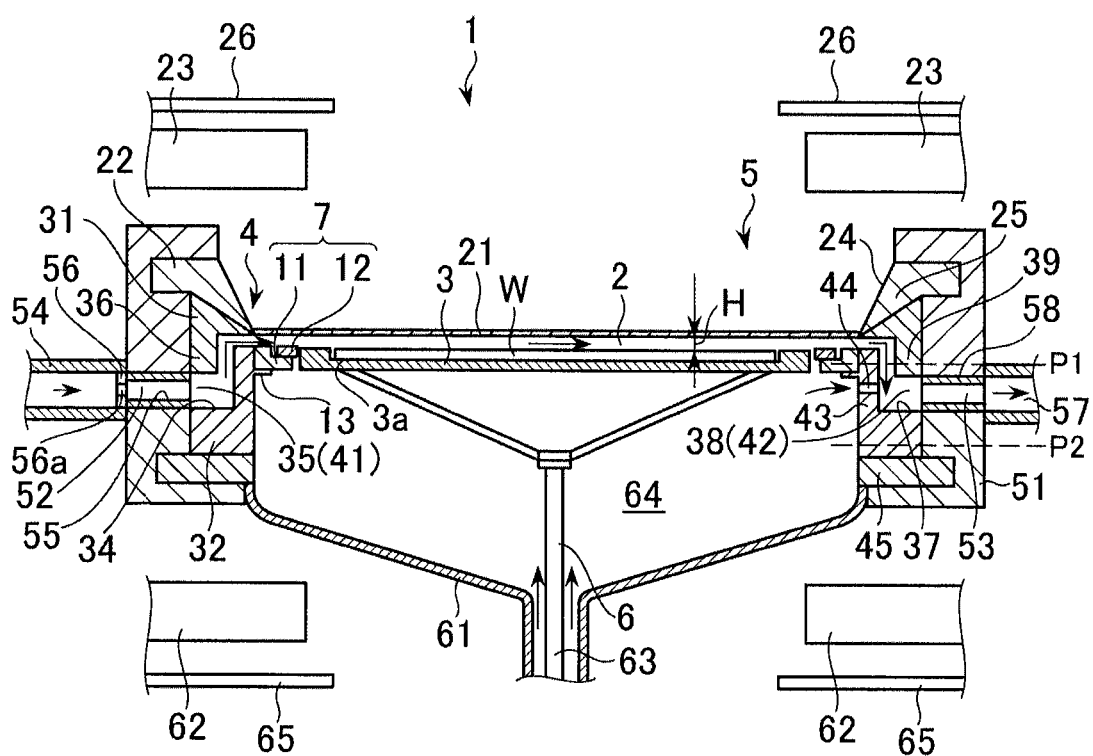
FIG. 1 is a cross-sectional view illustrating the entire configuration of an epitaxial growth apparatus according to an embodiment of the present disclosure.

The present disclosure is made in consideration of the above-mentioned circumstances to provide a film forming method using epitaxial growth and an epitaxial growth apparatus, which can achieve a stable and high growth rate while guaranteeing film quality from the viewpoint of a film thickness distribution or a resistivity distribution. More specifically, the present disclosure describes chamber components for such epitaxial growth apparatus that enable the film forming method. Exemplary chamber components include upper side wall, susceptor and rectification plate, improvements thereof have resulted in improvements to the uniformity and speed of the epitaxial layer formed on substrates resulting in higher throughput and lower defects.

According to an embodiment of the present disclosure, an upper side wall for an epitaxial growth apparatus is disclosed. The upper side wall includes a body comprising an upper surface including an annular shape configured to form an abutment with a ceiling plate, wherein the annular shape is disposed about a center axis. The upper side wall further includes a bottom surface including abutment surfaces and flow guiding surfaces. The abutment surfaces are configured to form an abutment with a lower sidewall supporting the upper side wall, and the flow guiding surface are configured to direct precursor gases to and from a substrate. The upper side wall further includes first and second convex portions each extending from the bottom surface, wherein the flow guiding surfaces are disposed between the first and the second convex portions. In this manner the precursor gases may be directed to and from the substrate with greater uniformity.

According to another embodiment of the present disclosure, a precursor gas subsystem for an epitaxial growth apparatus is disclosed. The precursor gas subsystem includes a reactant gas introducing portion comprising an output surface, and a plurality of output channels configured to deliver at least one precursor gas to the output surface. The precursor gas subsystem further includes a rectification plate. The rectification plate including a first surface, a second surface opposite the first surface, fastener holes, and a plurality of through holes extending from the first surface to the second surface and allocated into a plurality of groups. The plurality of groups are respectively associated with plurality of output channels, and the fastener holes are configured for fasteners to be inserted therethrough to attach the rectification plate to the reactant gas introduction portion. In this manner, a more uniform epitaxial layer may be formed on a substrate as cross flow leakage between the plurality of output channels is reduced.

According to another embodiment of the present disclosure, a susceptor for supporting a substrate within an epitaxial growth apparatus is disclosed. The susceptor includes an annular body extending to an outer radius from a center axis. The annular body includes a top surface and a bottom surface opposite the top surface. The top surface includes a concave portion disposed at the center axis and extending to an inner radius. The top surface further includes a non-concave portion disposed along the circumference of the annular body. The top surface further includes a transition portion connecting the concave portion to the non-concave portion. The transition portion is configured to form an abutment with the substrate and support the substrate, wherein the transition portion is at a higher elevation than the concave portion and at a lower elevation than the non-concave portion when the top surface is facing upward and the center axis is disposed vertically. The susceptor further includes a plurality of through holes extending from the top surface to the bottom surface, wherein the plurality of through holes is positioned within the concave portion and the non-concave portions. The density of the plurality of through holes in the concave portion and the non-concave portion is at least 5.0 through holes per square centimeters. In this manner, the substrate may be supported within the epitaxial growth apparatus with more homogeneous thermal characteristics to improve epitaxial layer formation uniformity.

Here, it is preferable that the ceiling plate be supported by the support so that a distance between the ceiling plate and the top surface of the substrate is equal to or less than a predetermined value.

The reactant gas supply path may be formed in a step shape ascending from an entrance of the reactant gas to an exit connected to the reaction chamber. In this case, plural source gases, which are raw materials of the reactant gas, are mixed in the reactant gas supply path of the step shape.

The gas discharge path may be connected to a gas discharge portion disposed outside the side wall and the gas discharge portion may be formed to have an opening narrowing from the inside connected to the gas discharge path to the outside.

A susceptor ring may be disposed on the outer circumference of the substrate mounting portion so as to pre-heat the reactant gas. The susceptor ring may include two members of an outer ring portion mounted on a flange portion disposed in the side wall and an inner ring portion mounted on a concave portion disposed on the top surface of the outer ring portion, and the inner ring portion may have such an inner diameter to reduce a gap between the circumferential edge of the substrate mounting portion and the inner circumferential edge of the substrate mounting portion and the inner circumferential edge of the outer ring portion. In this case, the reactant gas is prevented from flowing from the circumferential edge of the substrate mounting portion to the bottom surface of the substrate mounting portion by the use of the inner ring portion.

The substrate mounting portion may have plural through-holes.

First heating means for heating the reaction chamber to a predetermined growth temperature may be disposed above the reaction chamber, a first reflector may be disposed above the first heating means, second heating means for heating the reaction chamber to a predetermined growth temperature may be disposed below the reaction chamber, and a second reflector may be disposed below the second heating means. In this case, it is preferable that the first reflector include a first slope portion reflecting heat waves from the first heating means to the center of the reaction chamber and a first flat portion reflecting heat waves from the first heating means in a vertically-falling direction, and the first slope portion and the first flat portion be arranged so that an area ratio of the first slope portion and the first flat portion is a predetermined ration and a distribution of the first slope portion and the first flat portion is not biased. In addition, it is preferable that the second reflector include a second slope portion reflecting heat waves from the second heating means to the center of the reaction chamber and a second flat portion reflecting heat waves from the second heating means in a vertically-rising direction, and the second slope portion and the second flat portion be arranged so that an area ratio of the second slope portion and the second flat portion is a predetermined ratio and a distribution of the second slope portion and the second flat portion is not biased.

In the film forming method using epitaxial growth and the epitaxial growth apparatus according to the present disclosure, since the support supports the ceiling plate from the outer and upper sides of the ceiling plate, the distance between the top of the substrate and the ceiling plate is small and it is possible to satisfactorily support the ceiling plate even when a thermal stress is high. Therefore, it is possible to reduce the thickness of the boundary layer, thereby contributing to an increase in growth rate. On the other hand, before the reactant gas is introduced into the reaction chamber, the reactant gas is rectified in the reactant gas supply path disposed in the side wall so that a horizontal component in a flow direction of the reactant gas in the reaction chamber corresponds to a horizontal component in a direction extending from the center of an opening of the reactant gas supply path facing the reaction chamber to the center of the reaction chamber. Accordingly, it is possible to suppress an increase of the flow in which the reactant gas escapes toward the circumferential edge of the substrate on the surface of the substrate in the reaction chamber with a decrease in thickness of the boundary layer, thereby contributing to stabilization of the reactant gas flow. As a result, it is possible to achieve a stable and high growth rate while guaranteeing the film quality from the view point of a film thickness distribution or a resistivity distribution.

Hereinafter, an epitaxial growth apparatus according to an embodiment of the present disclosure and a film forming method using epitaxial growth, which is performed using the epitaxial growth apparatus, will be described. Also described are chamber components for such epitaxial growth apparatus that are particularly beneficial to obtaining the advantages of the film forming method.

Configuration of Epitaxial Growth Apparatus

Figure 2:
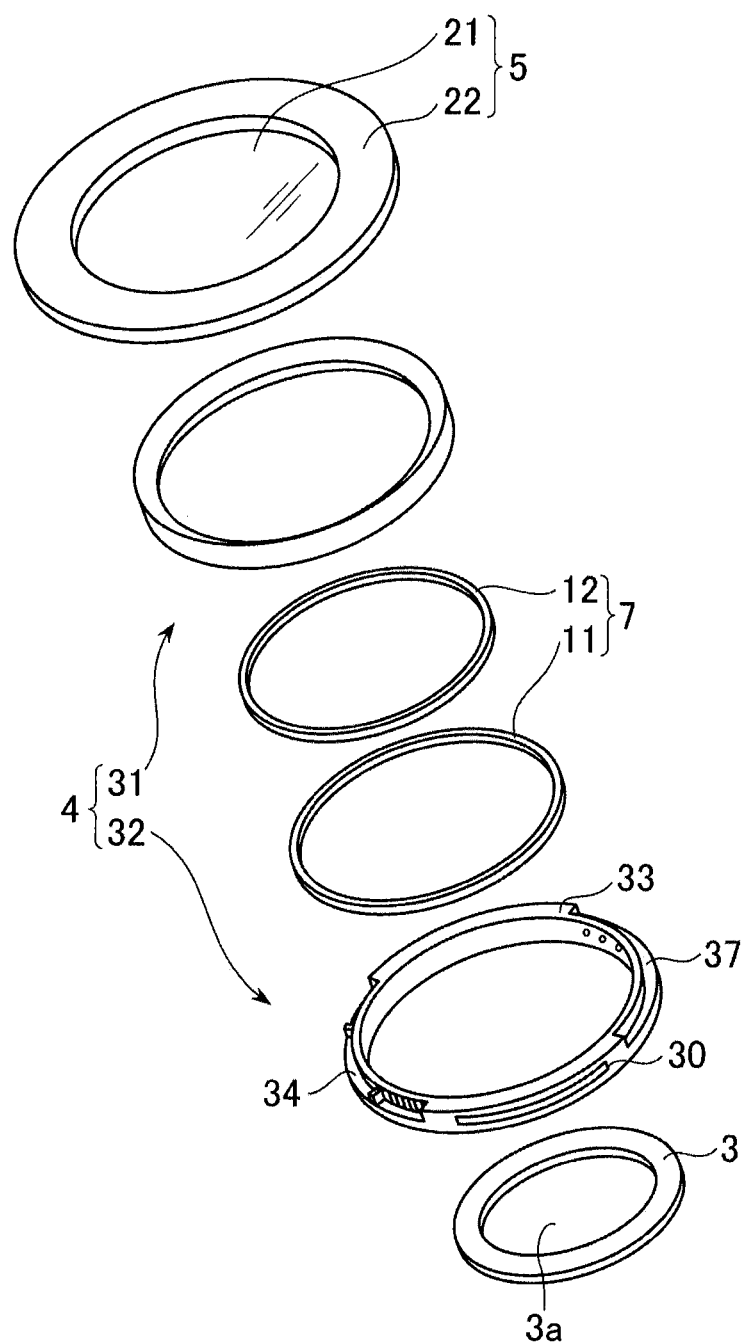
FIG. 2 is an exploded perspective view illustrating the configuration of a reaction chamber according to the embodiment of the present disclosure.
Figure 3:
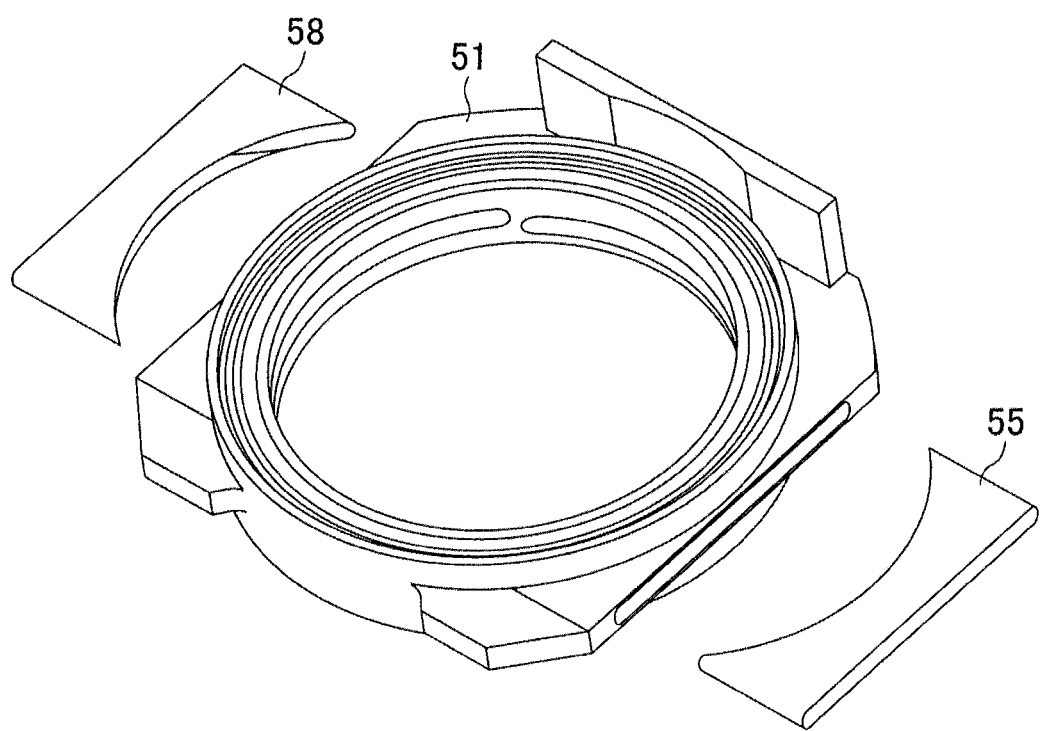
FIG. 3 is an exploded perspective view illustrating the outer configuration of the reaction chamber according to the embodiment of the present disclosure.

First, the configuration of an epitaxial growth apparatus 1 according to the embodiment of the present disclosure will be schematically described. FIG. 1 is a cross-sectional view illustrating the entire configuration of the epitaxial growth apparatus 1. FIG. 2 is an exploded perspective view illustrating the configuration of a reaction chamber 2 of the epitaxial growth apparatus 1. FIG. 3 is an exploded perspective view illustrating the outer configuration of the reaction chamber 2 of the epitaxial growth apparatus 1.

The epitaxial growth apparatus 1 is a film forming apparatus that enables, for example, a film of silicon to epitaxially grow on a substrate W.

The epitaxial growth apparatus 1 includes a reaction chamber 2. The reaction chamber 2 includes a susceptor 3 on which the substrate W is mounted, a side wall 4, and a ceiling 5.

The susceptor 3 is a plate-like member having a circular shape when seen from the upper side and has a size slightly larger than the substrate W. The susceptor 3 is provided with a substrate concave portion 3a on which the substrate W is mounted. The susceptor 3 is supported by a susceptor support 6 having plural arms.

The susceptor support 6 lifts up and down the susceptor 3 while supporting the susceptor 3. The lifting range of the surface of the susceptor 3 on which the substrate W is mounted ranges from a film-forming position P1 at which a film is formed on the substrate W on the susceptor 3 to a substrate-carrying position P2 at which the substrate W is put in and out of the epitaxial growth apparatus 1. The susceptor support 6 is configured to enable the susceptor 3 and the substrate W to rotate by rotating about the axis of the susceptor support 6 at the film-forming position P1.

An annular susceptor ring 7 is disposed around the susceptor 3 at the film-forming position P1. Although details will be described later, the susceptor ring 7 includes a first ring 11 and a second ring 12 placed on the first ring 11. The susceptor ring 7 is supported by a flange portion 13 disposed in the side wall 4 of the reaction chamber 2.

The ceiling portion 5 includes a ceiling plate 21 and a support 22 supporting the ceiling plate 21. The ceiling plate 21 has permeability and is configured to heat the inside of the reaction chamber 2 by transmitting heat from heating means 23 (for example, a halogen lamp) disposed above the outside of the ceiling plate 21 and an upper reflector 26. That is, the epitaxial growth apparatus 1 according to this embodiment is a cold wall type epitaxial growth apparatus. In this embodiment, the ceiling plate 21 is formed of quartz.

The support 22 supporting the ceiling plate 21 has an annular shape. The ceiling plate 21 is fixed to an end, which is close to the substrate W, of an opening 24 inside the inner edge of the support 22. An example of the fixing method is a welding method.

The side wall 4 includes an annular upper side wall 31 and an annular lower side wall 32. The flange portion 13 is disposed on the inner circumference of the lower side wall 32. A substrate carrying port 30 is disposed below the flange portion 13. The upper side wall 31 has a slope portion corresponding to a slope portion outside of a protrusion 25 of the support 22 on the top surface thereof. The support 22 is disposed on the slope of the upper side wall 31.

In the top surface of the lower side wall 32, a part of the outer circumference thereof is cut out of a region, in which the cutout is not formed, serves as a mounting surface 33 on which the upper side wall 31 is mounted. A first concave portion 34 is formed in the lower side wall 32 by the cutout of the lower side wall 32. That is, the first concave portion 34 is a concave portion formed in a part, in which the mounting surface 33 is not formed, of the top surface of the lower side wall 32. In the upper side wall 31, a first convex portion 36 is formed at the position corresponding to the first concave portion 34 at the time of mounting the upper side wall on the lower side wall 32 so as to correspond to the shape of the first concave portion 34 and to form a gap 35 between the first concave portion 34 and the first convex portion. The gap 35 between the first convex portion 36 and the first concave portion 34 serves as a reactant gas supply path 41 (supply path). Details of the reactant gas supply path 41 will be described later.

In the region opposed to the first concave portion 34 of the lower side wall 32, a part of the outer circumferential portion of the top surface of the lower side wall 32 is cut out to form a second convex portion 37. In the upper side wall 31, a second concave portion 39 is formed at the position corresponding to the second convex portion 37 at the time of mounting the upper side wall on the lower side wall 32 so as to correspond to the shape of the second convex portion 37 and to form a gap 38 between the second convex portion 37 and the second convex portion. A gas discharge path 42 is formed by the second convex portion 37 and the second concave portion 39 of the upper side wall 31.

In this way, the reactant gas supply path 41 and the gas discharge path 42 face each other in the reaction chamber 2 and the reactant gas in the reaction chamber 2 flows over the substrate W in the horizontal direction.

A purge hole 44 through which a purge gas is discharged is formed in a wall surface 43 constituting the second concave portion 37 of the lower side wall 32. The purge hole 44 is formed below the flange portion 13. In that the purge hole 44 is formed in the wall surface 43 constituting the second concave portion 37, the purge hole 44 communicates with the gas discharge path 42. Therefore, both the reactant gas and the purge gas are discharged through the gas discharge path 42.

An annular platform 45 is disposed on the bottom surface side of the lower side wall 32 of the side wall 4 and the side wall 4 is placed on the platform 45. The platform may be disposed within the annular clamping portion 51 (see FIG. 1).

An annular clamping portion 51 is disposed on the outer circumference sides of the ceiling portion 5, the side wall 4, and the platform 45, and the annular clamping portion 51 clamps and supports the ceiling portion 5, the side wall 4, and the platform 45. The clamping portion 51 is provided with a supply-side communication path 52 communicating with the reactant gas supply path 41 and a discharge-side communication path 53 communicating with the gas discharge path 42. A gas introduction tube 55 is inserted into the supply-side communication path 52. A gas discharge tube 58 is inserted into the discharge-side communication path 53.

A reactant gas introducing portion 54 is disposed outside the clamping portion 51, and the reactant gas introducing portion 54 and the supply-side communication path 52 communicate with each other. In this embodiment, a first source gas and a second source gas are introduced from the reactant gas introducing portion 54. The second source gas also serves as a carrier gas. A mixture of three or more types of gases may be used as the reactant gas. A rectification plate 56 is disposed in the joint of the supply-side communication path 52 and the reactant gas introducing portion 54, so as to be perpendicular to the gas flow channel. The rectification plate 56 is provided with plural holes 56a in a line along the circumferential direction, and the first source gas and the second source gas are mixed and rectified by causing the reactant gas to pass through the holes 56a. A gas discharge portion 57 is disposed outside the clamping portion 51. The gas discharge portion 57 is disposed at a position facing the reactant gas introducing portion 54 with the center of the reaction chamber 2 interposed therebetween.

An apparatus bottom portion 61 is disposed in the lower part of the inner circumference side of the platform 45. Another heating means 62 and a lower reflector 65 are disposed outside the apparatus bottom portion 61 and the substrate W can be heated from the lower side.

The center of the apparatus bottom portion 61 is provided with a purge gas introducing portion (not shown) through which the axis portion 63 of the susceptor support 6 is inserted and the purge gas is introduced. The purge gas in introduced into a lower reaction chamber part 64 formed by the apparatus bottom portion 61, the lower side wall 32, and the platform 45 from purge gas introducing means not shown and disposed in the purge gas introducing portion. The purge hole 44 communicates with the lower reaction chamber part 64.

Summary of Film Forming Method Using Epitaxial Growth

A film forming method using the epitaxial growth apparatus according to this embodiment will be described below.

First, the susceptor 3 is moved to the substrate-carrying position P2, a substrate W is put in from the substrate carrying port 30, and the susceptor 3 is moved to the film-forming position P1. For example, a silicon substrate with a diameter of 200 mm is used as the substrate W. Then, the substrate is heated from the standby temperature (for example, 800° C.) to the growth temperature (for example, 1100° C.) by the use of the heating means 23 and 62. The purge gas (for example, hydrogen) is introduced into the lower reaction chamber part 64 from the purge gas introducing portion. The reactant gas (for example, trichlorosilane as the first source gas and hydrogen as the second source gas) is introduced into the reaction chamber 2 through the reactant gas supply path 41 from the reactant gas introducing portion 54. The reactant gas forms a boundary layer on the surface of the substrate W and a reaction occurs in the boundary layer. Accordingly, a silicon film is formed on the substrate W. The reactant gas is discharged from the gas discharge path 42 communicating with the reaction chamber 2. The purge gas is discharged to the gas discharge path 42 through the purge hole 44. After the epitaxial growth ends in this way, the temperature falls to the standby temperature and the substrate W is taken out and is moved to another chamber of a semiconductor manufacturing apparatus.

Details of Film Forming Method Using Epitaxial Growth Apparatus

Details of the constituent members of the epitaxial growth apparatus 1 according to this embodiment and details of the film forming method according to this embodiment will be described below.

Figure 4:
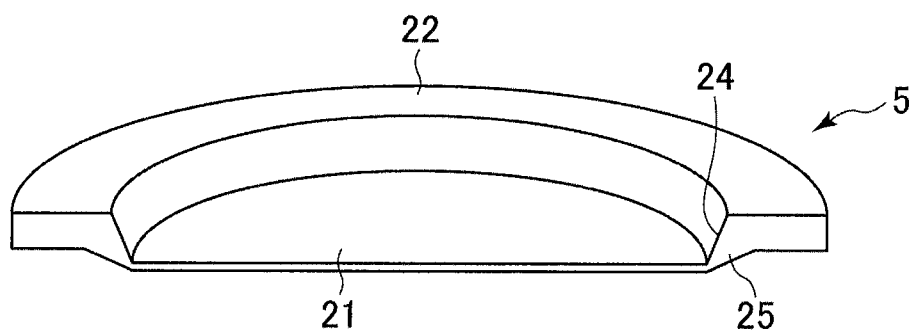
FIG. 4 is a perspective cross-sectional view illustrating the configuration of a ceiling portion according to the embodiment of the present disclosure.
Figure 5:
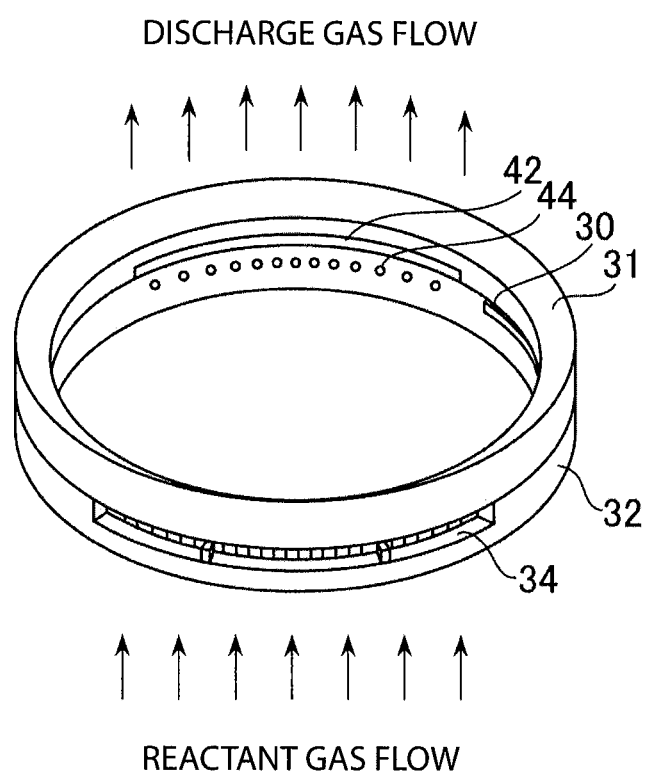
FIG. 5 is a diagram schematically illustrating the inner configuration of a side wall according to the embodiment of the present disclosure.
Figure 6:
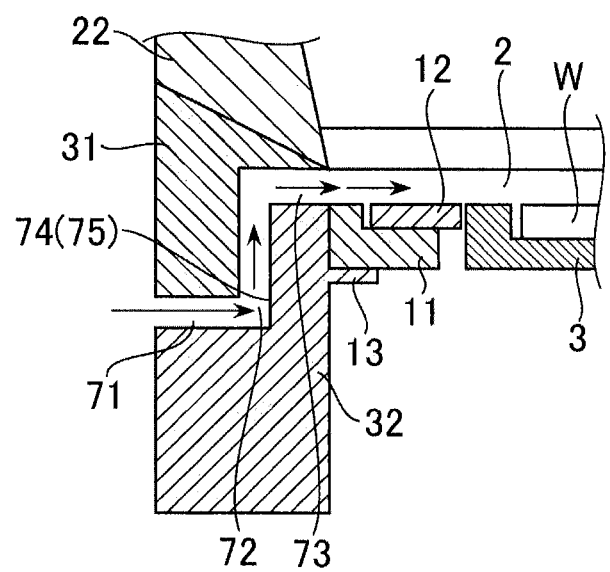
FIG. 6 is a cross-sectional view illustrating a reactant gas supply path according to the embodiment of the present disclosure.

FIG. 4 is a perspective cross-sectional view illustrating the configuration of the ceiling portion 5 in this embodiment. As shown in the drawing, the inner edge of the support 22 supporting the ceiling plate 21 has a diameter slowing decreasing toward the substrate. The ceiling plate 21 is fixed to an end portion of the inner edge facing the substrate W. When the support 22 is viewed from the rear side (bottom side), the inner circumferential portion protrudes to form a protrusion 25. The protrusion 25 is formed to have a diameter slowly decreasing in the protruding direction. In this way, the support 22 includes two slope portions. That is, the support 22 supports the ceiling plate 21 from the upper side and the outer side of the circumferential edge at the circumferential edge of the ceiling plate 21. The protrusion 25 prevents thermally induced stress cracks from developing in the support 22 by thickening the support 22 at an interface with the ceiling plate and thereby avoiding a stress concentration that would be otherwise formed in the support 22 without the protrusion 25.

FIG. 20A through 20F are a top perspective view, a bottom perspective view, a bottom view, a left side view, and a left cross-sectional view of the upper side wall 31 of FIG. 1. The upper side wall 31 includes a body 199 having top surface 200, which is configured to abut against the protrusion 25 of the support 22. The top surface 200 may be formed with a curved annular shape having a center axis A1. The curved annular shape may be uniform along the circumference of the upper side wall. The uniformity enables the support 22 to efficiently form an interface with the upper side wall 31. Further, the $q_0$ angle of the top surface may be angled at least eighteen degrees relative to a direction normal to the center axis A1 to enable the protrusion 25 to extend through the upper side wall 31 or substantially through the upper side wall 31 in order to dispose the ceiling plate 21 lower when the abutment interface is formed and thereby reduce the distance H between the substrate W and the ceiling plate 21.

The upper side wall 31 further includes the first and second convex portions 36, 37 that extend parallel to the center axis A1 from the bottom surface 202 of the upper side wall 31. The first and second convex portions 36, 37 may respectively include inner surfaces 205A, 205B which face each other and may be disposed equidistant from the center axis A1. The first and the second convex portions 36, 37 correspond to the shapes of the first and second concave portions 34, 39 of the lower side wall 32 wherein the gaps 35, 38 disposed respectively therebetween serve as the reactant gas supply 41 and the gas discharge path 42. The first and second convex portions 36, 37 may each extend along a circumference of the upper side wall 31 according to respective angular lengths $q_1$, $q_2$. The angular lengths are in a range from seventy-five (75) degrees to one-hundred ten (110) degrees. The angular lengths $q_1$, $q_2$ enable the precursor gases to provide uniform coverage over the substrate W and to exit the reaction chamber 2 (FIG. 1) after traversing the substrate W. The angular lengths $q_1$, $q_2$ may be different from each other to account for the temperature changes and mass changes of the precursor gases as they enter and depart the reaction chamber 2, but preferably they are the same. The bottom surface 202 of the upper side wall may include flow guiding surfaces 204A, 204B disposed between the first and second convex portions 36, 37. The flow guiding surfaces 204A, 204B are used to guide the reactant gas supply 41 to and from the reaction chamber 2 respectively. The flow guiding surface 204A may be disposed parallel to or substantially parallel to the substrate W (or orthogonal to the center axis A1) to facilitate the formation of a uniform boundary layer of the precursor gases at the substrate W. The flow guiding surface 204B may be disposed at a non-orthogonal angle relative to the center axis A1 to facilitate an efficient removal of the precursor gases from the substrate W after the precursor gases have traversed the substrate W. In this manner, the upper side wall 31 may direct the precursor gases to and from the substrate W to enhance uniformity.

It is noted that the bottom surface 202 of the upper side wall 31 also includes abutment surfaces 206A, 206B arranged to form an abutment against the lower side wall 32. The abutment surfaces 206A, 206B may be disposed orthogonal to the center axis A1 to facilitate efficient installation upon the lower side wall 32. The body of the upper side wall 31 may also comprise quartz for low thermal expansion and high temperature resistance during operation. The body of the upper side wall 31 may be formed integrally to minimize the opportunity for thermal stress cracking during operation.

In this way, in this embodiment, since the support 22 is formed in such a shape on which a stress is less concentrated than that in the related art, the distance H between the substrate W and the ceiling plate 21 can be reduced, that is, less than 10 mm.

Specifically, most infrared rays from the heating means 23 passes through the ceiling plate 21, but the ceiling plate 21 absorbs radiant heat from the susceptor 3 or the substrate W. The absorbed heat is input to the support 22 through the joint with the support 22 from the ceiling plate 21. Here, when the distance H between the substrate W and the ceiling plate 21 is reduced, the amount of radiant heat absorbed increases and the amount of heat input to the support 22 increases. Therefore, when the support 22 has a substantially rectangular corner 25' as in the ceiling portion 5' in the related art, a stress may be concentrated on the corner 25' to generate cracks or the like.

On the other hand, in this embodiment, by forming the protrusion 25 in the support 22 and supporting the ceiling plate 21 from the upper side and the outer side of the circumferential edge at the circumferential edge of the ceiling plate 21, the ceiling plate 21 can be supported to the substrate side without forming the corner (25') on which a stress is easily concentrated as small as possible.

In this embodiment, since the distance between the ceiling plate 21 and the substrate W is reduced to narrow the boundary layer as described above, the reactant gas is likely to escape to the outside of the substrate W and the film thickness distribution of the substrate may not be uniformized well, which should be preferably prevented. Accordingly, in this embodiment, a guide portion is disposed in the reactant gas supply path 41 to uniformize the gas flow, as described below.

The guide portion disposed in the reactant gas supply path 41 will be described below in detail with reference to FIGS. 5 to 7B. As described above, the reactant gas supply path 41 is formed by the first concave portion 34 of the lower side wall 32 and the first convex portion 36 of the upper side wall 31 and communicates with the reactant gas introducing portion 54 through the gas introducing tube 55 in the supply-side communication path 52. The reactant gas supply path 41 includes a first supply path 71 extending in the direction (horizontal direction) corresponding to the gas introduction direction from the reactant gas introducing portion 54, a second supply path 72 communicating with the first supply path 71 and extending the direction (vertical direction) perpendicular to the gas introduction direction, and a third supply path 73 communicating with the second supply path 72 and extending in the direction (horizontal direction) parallel to the gas introduction direction. The third supply path 73 communicates with the reaction chamber 2. That is, the reactant gas supply path 41 is formed in a step shape ascending from the supply-side communication path 52, which is the entrance of the reactant gas to the exit, which is the exit of the reactant gas and is connected to the reaction chamber 2.

Here, since the second supply path 72 extends in the vertical direction as described above, the gas introduced from the reactant gas introducing portion comes in contact with a wall surface 74 of the second supply path 72 facing the reactant gas introducing portion 54. Accordingly, the reactant gas is diffused and the mixing property of the reactant gas is improved. That is, the second supply path 72 serves as a mixing chamber of the reactant gas. In this case, a groove 75 extending in the vertical direction is formed in the wall surface 74 of the second supply path 72 in this embodiment so as for the reactant gas no to stay in the second supply path 72, and the groove 75 serves as a guide portion. Since the groove 75 is formed in this way, the gas diffused by contact with the wall surface 74 of the second supply path 72 can easily flow into the third supply path 73, can be rectified along the groove 75 to improve the rectilinear flowing property of the reactant gas, thereby suppressing diffusion of the reactant gas when the reactant gas flows in the reaction chamber 2.

Figure 7A:
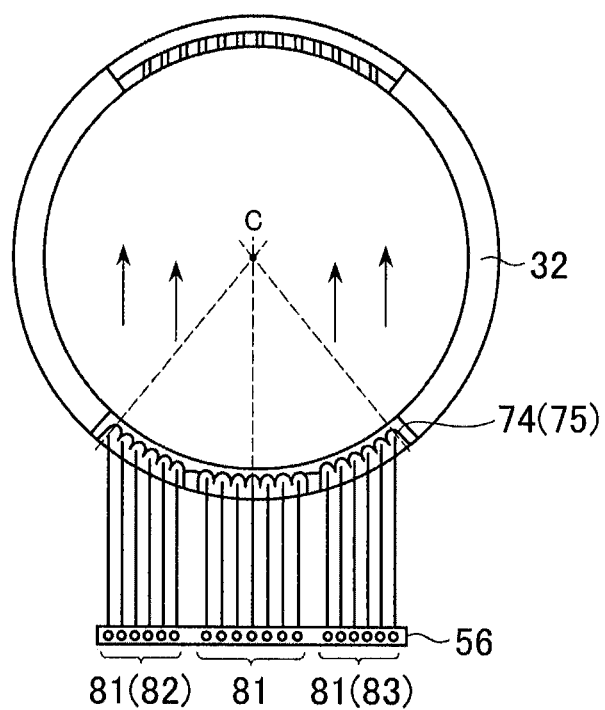
FIGS. 7A and 7B are diagrams schematically illustrating the reactant gas supply path according to the embodiment of the present disclosure.
Figure 7B:
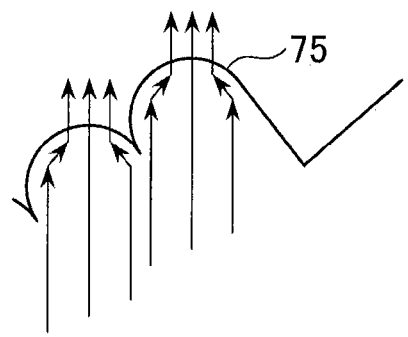

The groove 75 will be described below in detail. Plural grooves 75 are continuously formed as a concave portion in the entire surface of the wall surface 74 of the second supply path 72. As shown in FIG. 7B, the grooves 75 as the concave portion are curved in the width direction of the groves in this embodiment, each groove 75 as an arc shape when viewed from the top side. Since the groove 75 is curved in the width direction, the reactant gas is not likely to be diffused (is likely to be concentrated) when the reactant gas comes in contact with the bottom of the grooves 75 of the wall surface 74, and is not likely to be diffused to the outside of the substrate W when the reactant gas flows in the reaction chamber 2. When the depth of the grooves 75 is excessively large, the diffusion can be suppressed but the first source gas and the second source gas in the reactant gas is not likely to be mixed. In an embodiment of the present disclosure, that the depth of the grooves 75 is preferably set to a range of 1 mm to 5 mm and more preferably 3 mm.

The grooves 75 are formed toward the center c in the in-plane direction of the lower side wall 32. That is, the grooves 75 are arranged along the circumferential direction of the lower side wall 32. By arranging the grooves in this way, the rectification property can be enhanced so that the horizontal component in the flow direction of the reactant gas guide by the grooves 75 and introduced into the reaction chamber 2 corresponds to the horizontal component in the direction extending from the center of the opening of the reactant gas supply path 41 facing the reaction chamber 2 to the center of the reaction chamber 2, thereby suppressing diffusion of the reactant gas in the reaction chamber 2.

The grooves 75 are formed at positions at which the center in the width direction of each groove 75 substantially agrees (corresponds) to the center of each hole 56a of the rectification plate 56 disposed in the reactant gas introducing portion 54. That is, in this embodiment, the number of grooves 75 in the wall surface 74 is equal to the number of holes 56a. Accordingly, since the reactant gas rectified by the rectification plate 56 flows in the grooves 75, the rectification performance is further enhanced to improve the rectilinear flowing property of the reactant gas.

In this embodiment, the grooves 75 are formed in the entire surface of the wall surface 74 of the second supply path 72, but may be formed at least in an end portion of the wall surface 74 of the second supply path 72. The end portion means a portion corresponding to the extreme end region of plural regions into which the holes of the rectification plate 56 are divided. For example, in the example shown in FIGS. 7A and 7B, the rectification plate 56 are divided into three regions 81 and the grooves 75 have only to be formed to correspond to the holes of the extreme end regions 82 and 83. Since the reactant gas is likely to escape to the outside of the substrate W as described above, it is particularly preferable that the grooves 75 are formed to enhance the rectilinear flowing property of the reactant gas in the end portions of the reactant gas supply path 41. In this case, by forming the grooves 75 serving as a guide in the form of a concave portion, it is possible to easily obtain such an effect. For example, when a rectifying member is separately disposed in the second supply path 72, a problem may occur in the mixing property of the reactant gas or the manufacturing cost. However, such as problem is solved by forming the grooves 75 as a concave portion as in this embodiment.

Figure 8A:
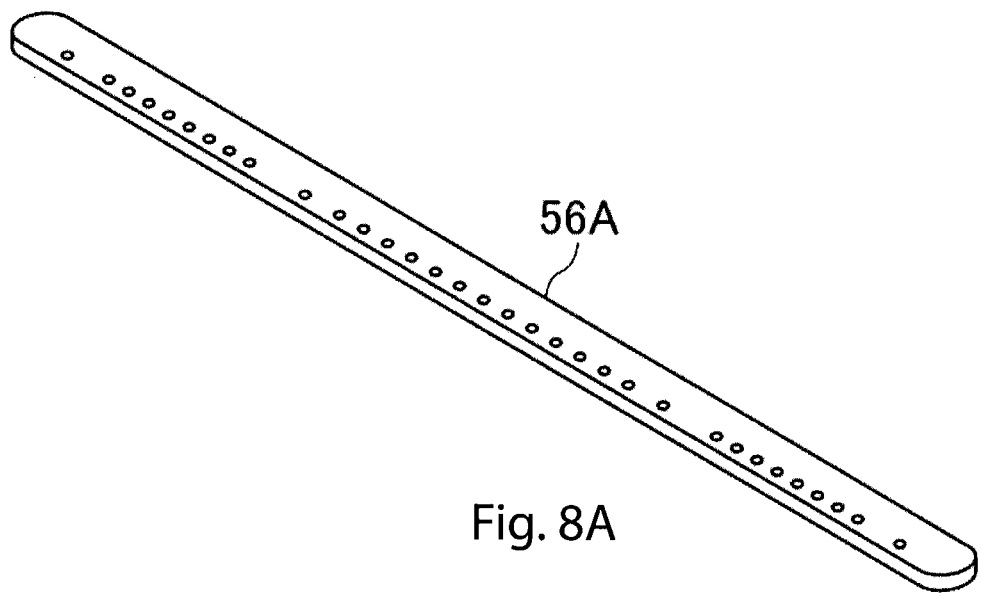
FIGS. 8A and 8B are perspective views illustrating an example of a rectification plate according to the embodiment of the present disclosure.
Figure 8B:
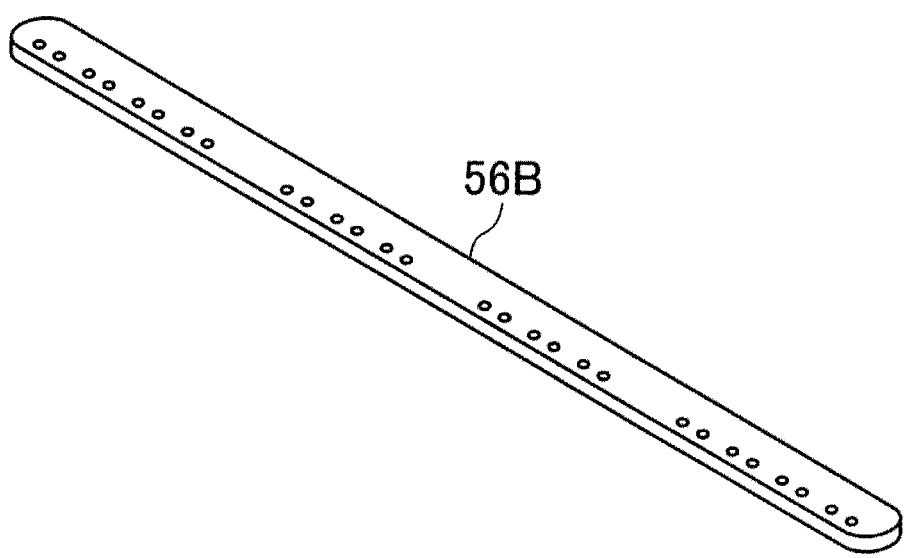

FIGS. 8A and 8B are perspective views illustrating an example of the rectification plate 56. As shown in the drawings, the through holes of the rectification plate 56 are configured to follow the pattern of the grooves 75. The opening ratio of the rectification plate 56 is preferably determined to be an optimal value in consideration of incidental equipment such as a scrubber or the shape, the length, and the like of an external pipe, as well as the viewpoint of growth rate.

Figure 24A:
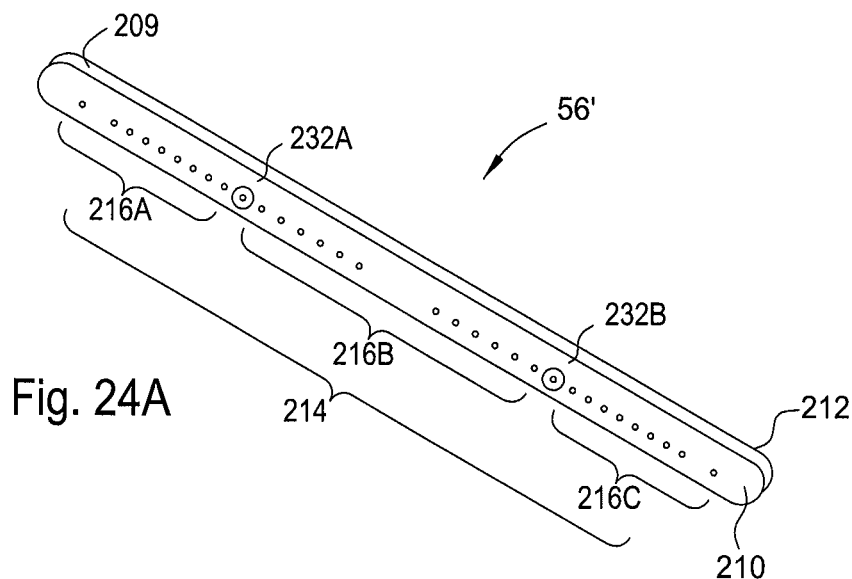
FIGS. 24A through 24C are a top front perspective view, a front view, and a top view, respectively, of another embodiment of the rectification plate of FIGS. 8A and 8B.
Figure 24B:
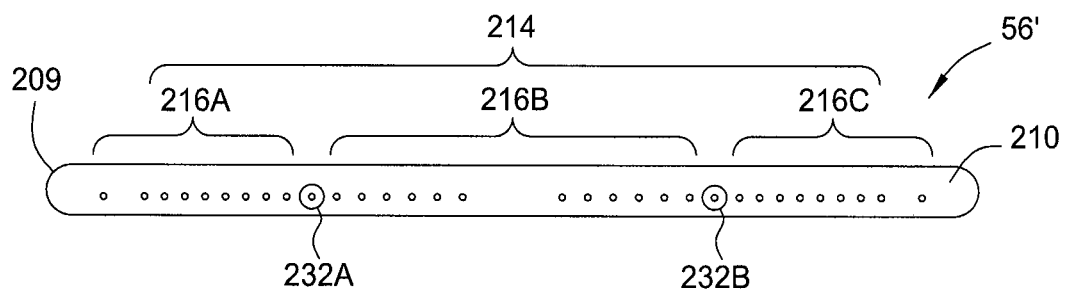
Figure 24C:
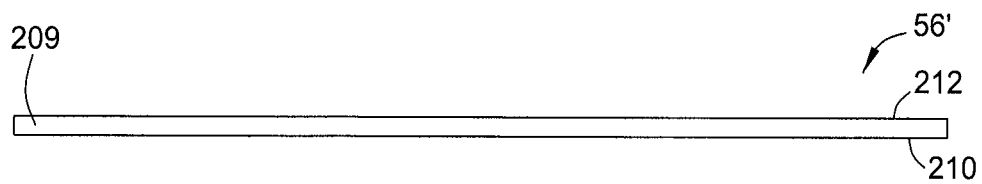

FIGS. 24A through 24C are a top front perspective view, a front view, and a top view, respectively, of a rectification plate 56' that is another embodiment of the rectification plate of FIGS. 8A and 8B. It has been observed that the rectification plate 56' results in a higher degree of control of the precursor gases during entry into the reaction chamber 2, which facilitates better uniformity. The rectification plate 56' comprises an elongated body 209 including a first surface 210 and a second surface 212 opposite the first surface 210 and separated by less than five (5) millimeters. The rectification plate 56' includes through holes 214 having circular cross-sections extending from the first surface 210 to the second surface 212. The through holes 214 may have diameters less than 3.5 millimeters for precise flow control. The center axes of the through holes 214 may be disposed orthogonal or non-orthogonal to the first surface 210 and the second surface 212, but preferably orthogonal and parallel to each other to direct the precursor gases through the rectification plate 56' to facilitate more uniform flow. The through holes 214 may be allocated into a plurality of groups 216A, 216B, 216C corresponding to the three regions 81, 81(82), 81(83). As the grooves 75 of the lower side wall 32 may be disposed at the same elevation, the through holes 214 may open to the first surface 210 at positions aligned along the first surface 210. In this manner, the through holes 214 may direct the precursor gases to the grooves 75 of the lower side wall 32.

Figure 25A:
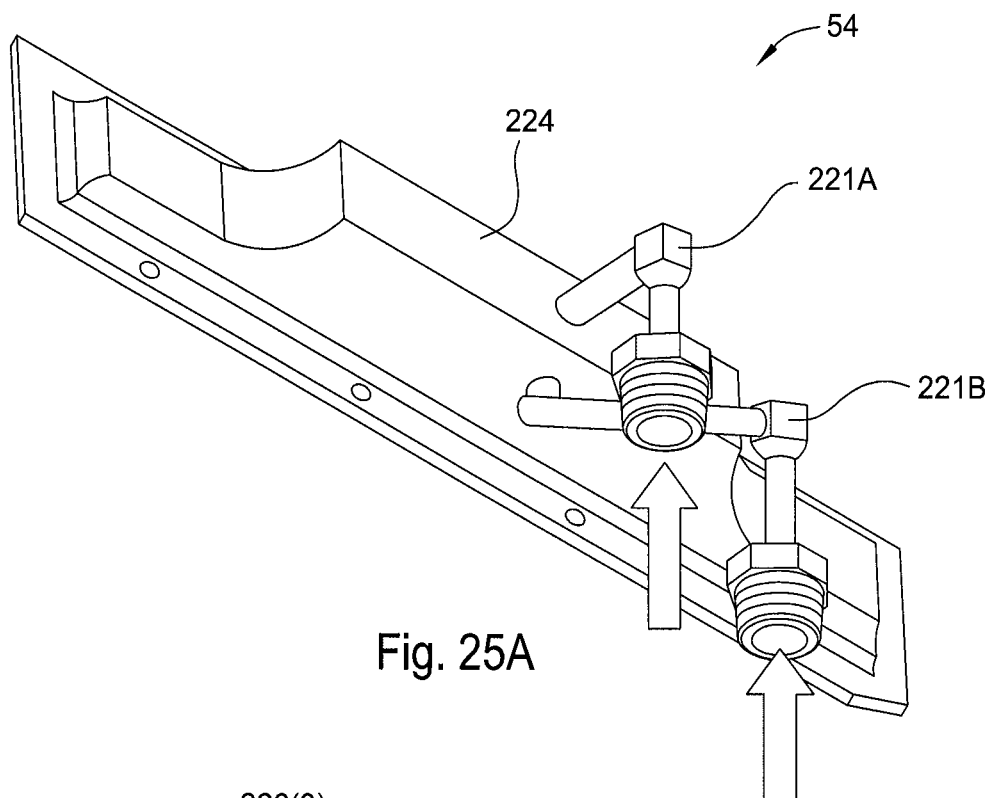
FIGS. 25A and 25B are a front bottom perspective view and a rear bottom perspective view, respectively, of a reactant gas introducing portion upstream of the rectification plate of FIG. 24A.
Figure 25B:
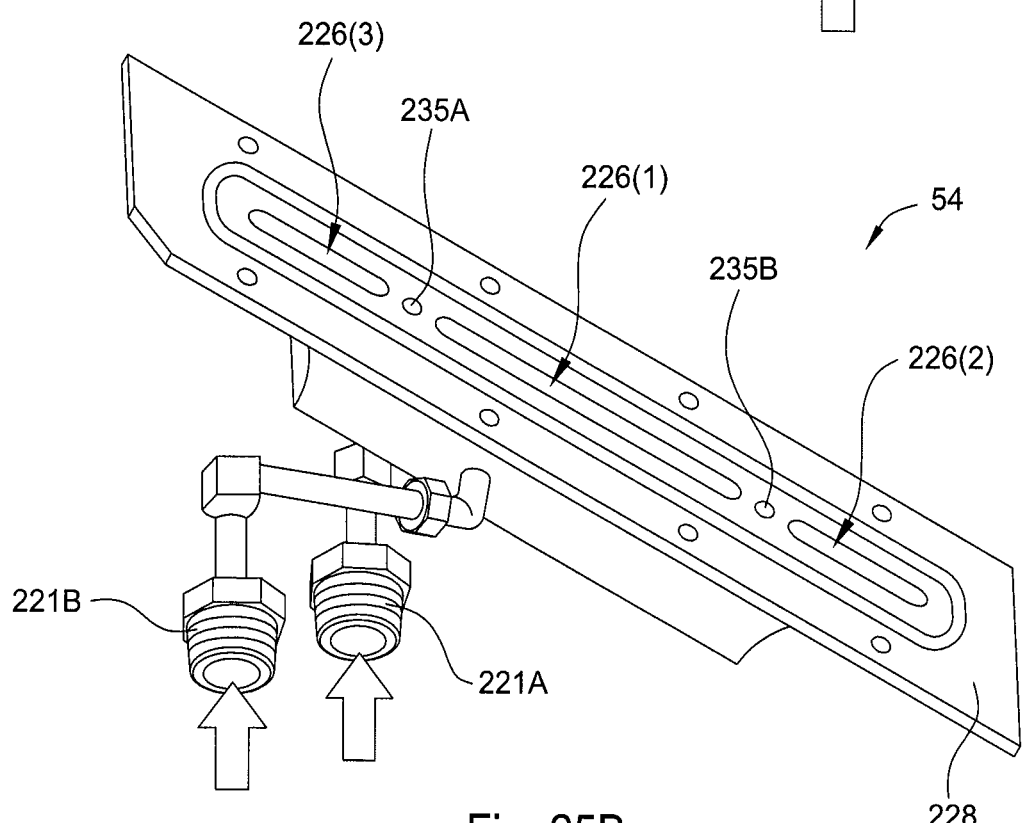
Figure 25C:
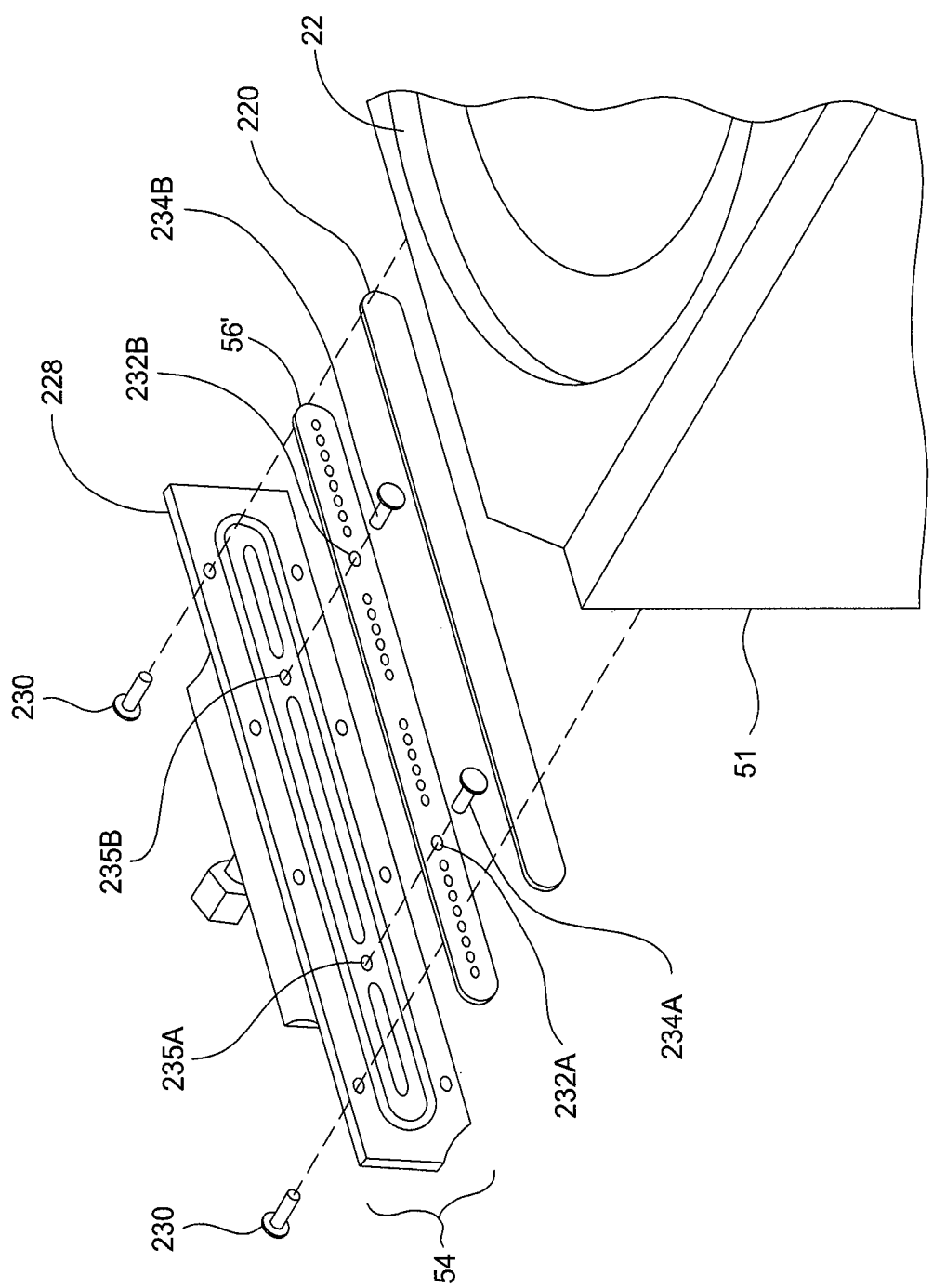
FIG. 25C is a partial top perspective exploded view of an example of the epitaxial growth apparatus of FIG. 1 depicting the rectification plate of FIG. 24A and the reactant gas introducing portion of FIG. 25A.

The location and size of each of the through holes 214 of the rectification plate 56' may be configured to provide a predetermined distribution of the precursor gases to the grooves 75 and thereby may be unequally spaced within the at least three groups 216A, 216B, 216C. The rectification plate 56' operates in coordination with a gasket 220, the reactant gas introducing portion 54, and the annular clamping portion 51. In this regard, FIGS. 25A and 25B are a back bottom perspective view and a front bottom perspective view, respectively, of the reactant gas introducing portion 54 upstream of the rectification plate of FIG. 24A. The reactant gas introducing portion 54 may include one or more flow inlet units 221A, 221B to receive the precursor gases into a gas mixing plenum 224. The reactant gas introducing portion 54 includes three output channels 226(1)-226(3) corresponding respectively to the regions 81, 81(82), 81(83) of the rectification plate 56'. The reactant gas introducing portion 54 includes an output surface 228 where the reactant gases exit the three output channels 226(1)-226(3) at a location upstream of the rectification plate 56'. As depicted in FIG. 25C, the reactant gas introducing portion 54 may be fastened, for example with one or more fasteners 230, to the annular clamping portion 51 and sealed thereto with the gasket 220 therebetween. It has been found that flow rates of the precursor gas flowing through the three output channels 226(1)-226(3) has not in some cases been observed in corresponding respective ones of the regions 81, 81(82), 81(83) of the rectification plate 56' resulting in non-uniformity of the flow of the precursor gas over the substrate W.

In order to fix this non-uniformity, modifications have been incorporated into the rectification plate 56'. In this regard, unlike the rectification plate 56 of FIG. 8A, the rectification plate 56' of FIG. 24A includes fastener holes 232A, 232B configured for fasteners 234A, 234B to more securely attach the rectification plate 56' to the reactant gas introducing portion 54 at securing holes 235A, 235B disposed at output surface 228. Diameters of the fastener holes 232A, 232B may be larger than those of the through holes 214 to enable sufficient sized fasteners, for example greater than 3.5 millimeters diameter, to securely attach the rectification plate 56' to the reactant gas introducing portion 54. The fasteners 234A, 234B help prevent flow exchange (or leakage) of the precursor gases between the three output channels 226(1)-226(3) and upstream of the rectification plate 56'. The fastener holes 232A, 232B may be disposed between or substantially between each adjacent pairs of the plurality of groups 216A, 216B, 216C, and the securing holes 235A, 235B may be disposed between each adjacent pairs of the three output channels 226(1)-226(3). The fastener holes 232A, 232B may also be aligned with the through holes 214. In this manner, flow exchange between the three output channels 226(1)-226(3) and upstream of the rectification plate 56' is prevented. The flow rates of the precursor gases at the three output channels 226(1)-226(3) better correspond with the flow rates of the respective regions 81, 81(82), 81(83) of the rectification plate 56' resulting in a high level of flow uniformity of the precursor gases over the substrate W.

Uniformity and boundary layer control are only two factors to consider when facilitating uniformity and growth rate of the epitaxial layer upon the substrate W. In this embodiment, since the distance between the ceiling plate 21 and the substrate W is reduced to narrow the boundary layer as described above, the reactant gas may easily flow into the lower part of the reaction chamber 2 and the temperature distribution of the substrate W may not be likely to be uniformized. As a result, the degradation in the film thickness distribution or the film quality at the time of forming a thick film (for example, distribution of resistivity or occurrence of crystal defects) may be caused. In this embodiment, in order to prevent these problems, the susceptor ring 7 is formed by two members. This point will be described below.

Figure 9:
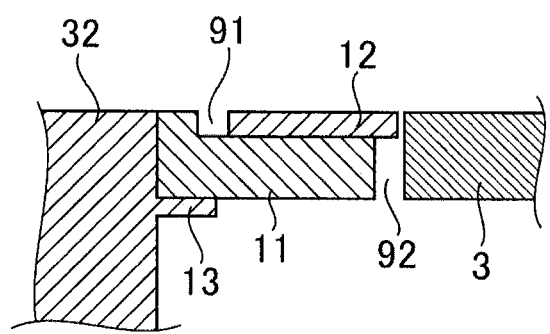
FIG. 9 is a partial cross-sectional view illustrating an example of a susceptor ring according to the embodiment of the present disclosure.

As enlarged in FIG. 9, the first ring 11 of the susceptor ring 7 is disposed spaced apart from the outer circumference of the susceptor and a stepped portion 91 having a low top surface is formed in the inner circumference of the first ring. The second ring 12 is placed on the stepped portion 91 and the second ring 12 is formed to face a clearance portion 92 formed between the first ring 11 and the susceptor 3, that is, to protrude to the clearance portion 92. The second ring 12 is disposed so that the top surface thereof is flush with the top surface of the susceptor 3. By making the top surface of the second ring 12 flush with the top surface of the susceptor 3 in this way, the reactant gas which is maintained in a state mixed and rectified in the reactance gas supply path 41 or the like can be smoothly supplied to the substrate W without lowering the flow rate as much as possible. The top surface of the susceptor 3 mentioned herein means a top surface of the susceptor 3 in a region in which the substrate concave portion 3a (see FIGS. 1, 2, 11, and 12) is not formed. The second ring 12 in this embodiment is formed of silicon carbide in consideration of thermal conductivity.

By forming the second ring 12 and the first ring 11 out of different members in this way, the susceptor ring 7 can be constructed with more accuracy. That is, the distance between the susceptor ring 7 and the susceptor 3 can be reduced to the limit and it is thus possible to reduce flowing of the reactant gas to the rear side of the substrate W, that is, to the bottom side 64 of the reaction chamber and to uniformize the temperature distribution of the substrate W. As a result, according to this embodiment, the film thickness distribution of the film quality distribution of the formed film is uniformized.

By providing two members of the first ring 11 and the second ring 12, the conduction of heat between the first ring 11 and the second ring 12 can be suppressed more than the case where the first ring 11 and the second ring 12 are formed of a single member.

By causing the second ring 12 to face the clearance portion 92 in this way, it is possible to reduce leakage of the reactant gas from between the susceptor ring 7 and the susceptor 3 toward the lower side at the time of forming a film and thus the flow of the reactant gas is not likely to be disturbed. Since leakage of the reactant gas to the lower side can be reduced, it is possible to reduce particles.

In this case, the second ring 12 is thinner than the first ring 11. Accordingly, it is possible to suppress heat loss from the susceptor 3 by radiation. Since the second ring 12 is thinner, it is possible to reduce the amount of heat for maintaining (pre-heating) the second ring 12 at a predetermined high temperature. In another embodiment, when the first ring 11 is formed of a material having small thermal conductivity, the first ring 11 serves as a thermal insulator, thereby further enhancing the above-mentioned effect.

In this embodiment, the second ring 12 is configured to face the clearance portion 92, but the disclosure is not limited to this configuration. The susceptor ring 7 can be constructed with high precision as long as the second ring 12 is placed at least on the stepped portion 91 of the first ring 11. Accordingly, the distance between the susceptor ring 7 and the susceptor 3 can be reduced to the limit and it is thus possible to reduce flowing of the reactant gas to the rear side of the substrate W and to uniformize the temperature distribution of the substrate.

In this embodiment, since the distance between the ceiling plate 21 and the substrate W is reduced to narrow the boundary layer, the ceiling surface of the ceiling plate 21 can be easily coated with the reactant gas. When the ceiling surface is coated, the ceiling surface is bedimmed and thus a film may not be satisfactorily formed using a cold wall type epitaxial growth apparatus that is heated using heating means 23 via the ceiling plate 21. On the contrary, in this embodiment, by forming the grooves 75 in the wall surface of the reactant gas supply path 41 and forming the susceptor ring 7 out of two members as described above, the reactant gas is not likely to stay in the reaction chamber 2 and it is thus possible to suppress attachment of a coating material. As a result, it is possible to form a film continuously and satisfactorily.

Figure 10:
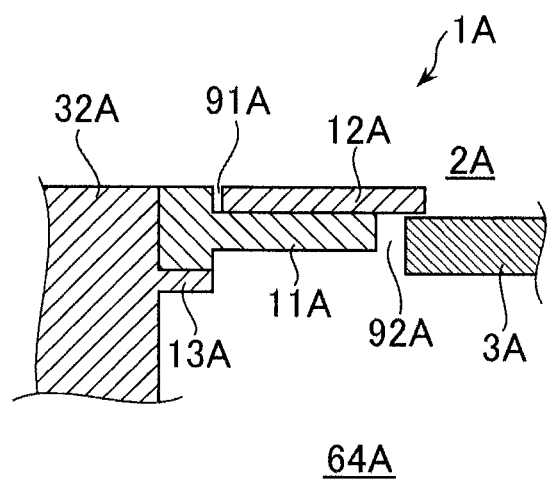
FIG. 10 is a partial cross-sectional view illustrating another example of the susceptor ring according to the embodiment of the present disclosure.
Figure 11:
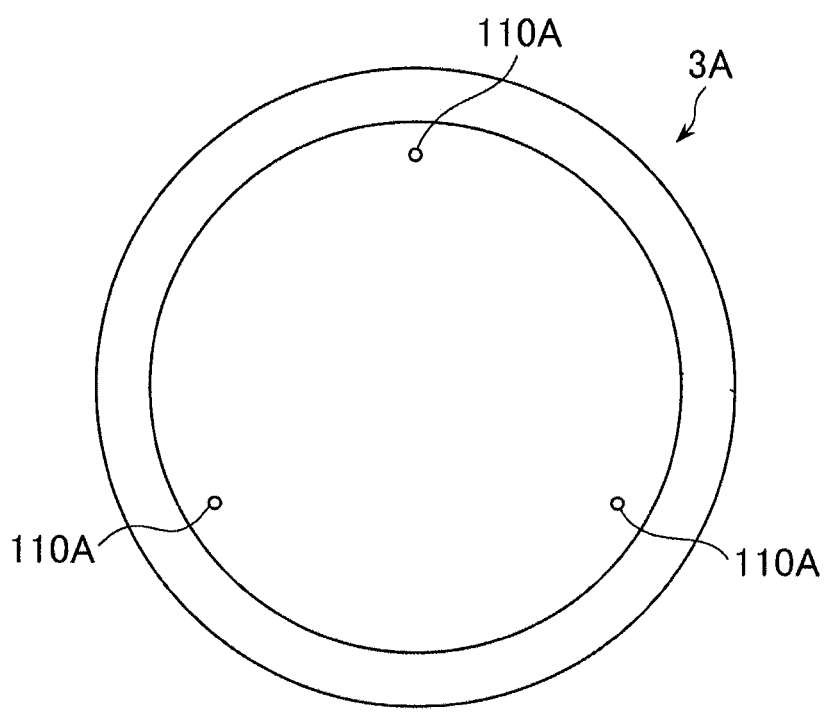
FIG. 11 is a top plan view illustrating an example of a susceptor according to the embodiment of the present disclosure.

FIG. 10 shows a modification example of the susceptor ring 7. This modification example is different from the embodiment shown in FIG. 9, in that a second ring 12A is disposed to cover a clearance portion 92A. In this modification example, a first ring 11A is placed on a flange portion 13A of a side wall 32A. The second ring 12A is placed on a stepped portion 91A of the first ring 11A and the inner circumference faces the outer circumference of the susceptor 3A.

In this modification example, since the second ring 12A is disposed to cover the clearance portion 92A, it is possible to further suppress flowing of the reactant gas flowing into the reaction chamber 2A to the lower reaction chamber part 64A. Here, in order to prevent the second ring 12A from blocking heating of the susceptor 3A from the heating means 23 not shown in FIG. 10, it is preferable that the overlap area of the second ring 12A and the susceptor 3A be small.

In this modification example, the thickness of the second ring 12A is preferably set to, for example, a range of 0.5 mm to 2 mm and more preferable about 0.8 mm. By setting this thickness, it is possible to suppress heat loss due to radiation from the susceptor 3A to the second ring 12A as much as possible.

Figures 12E, 12F:
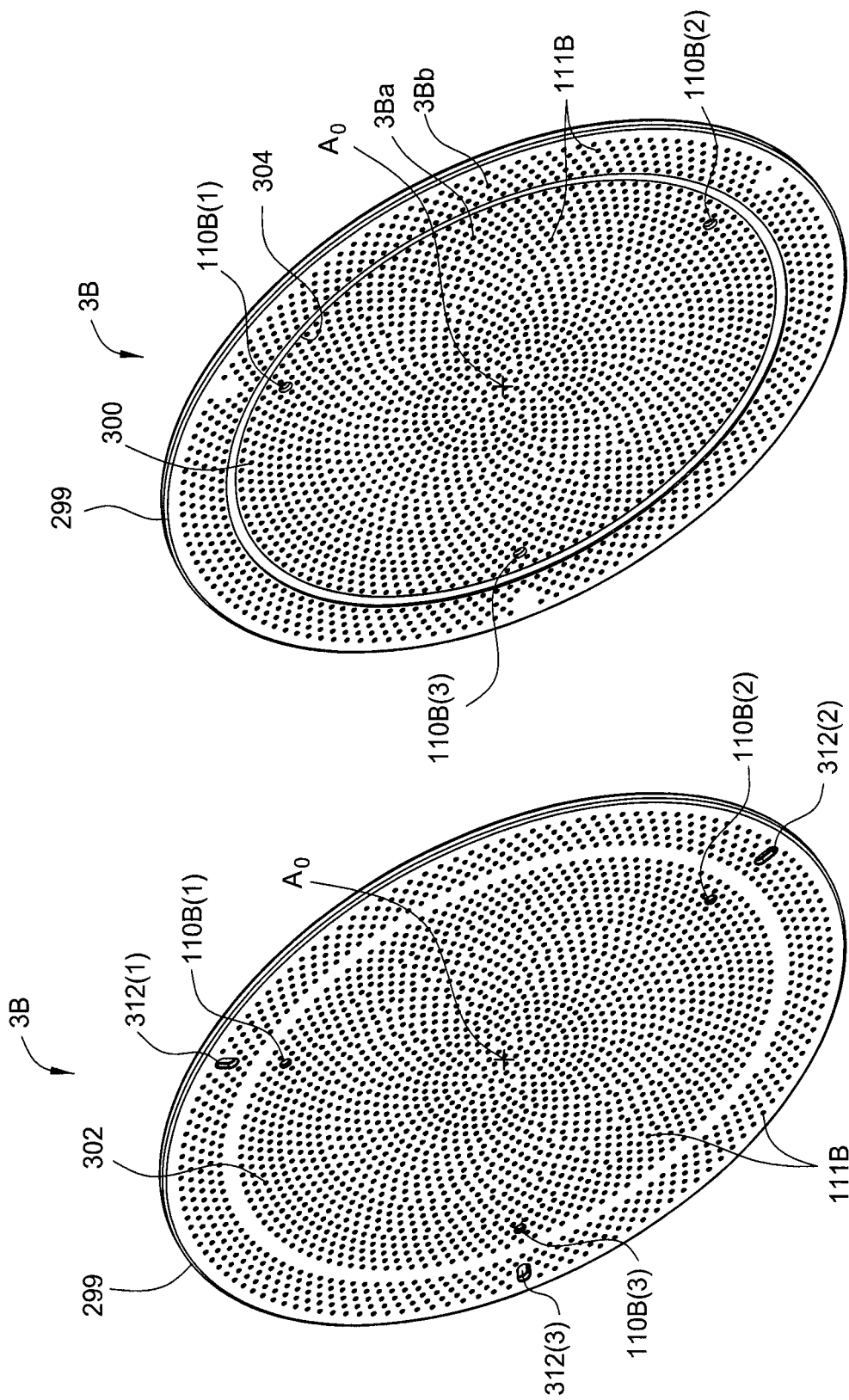
Figure 12G:
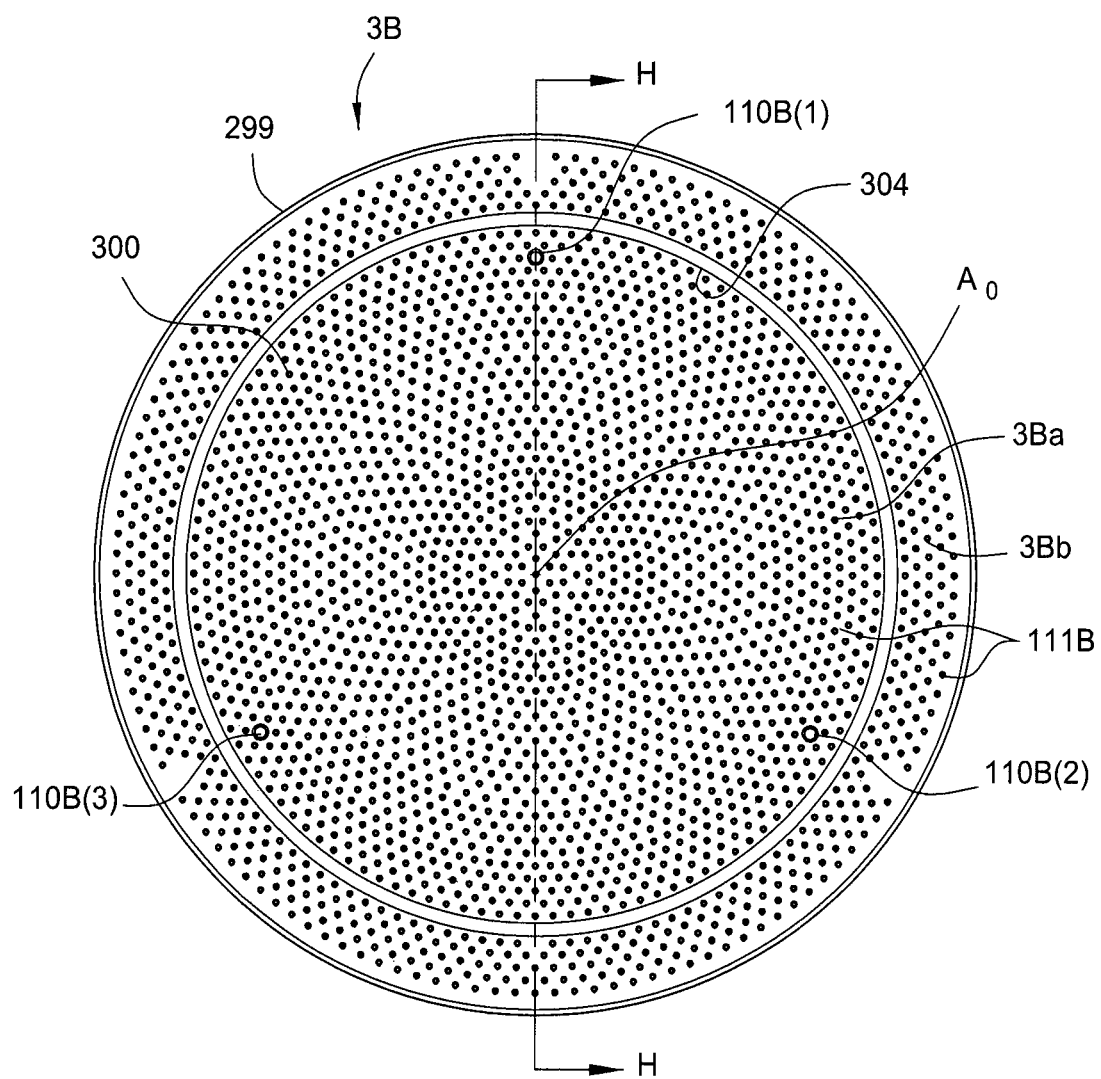
Figure 12H:
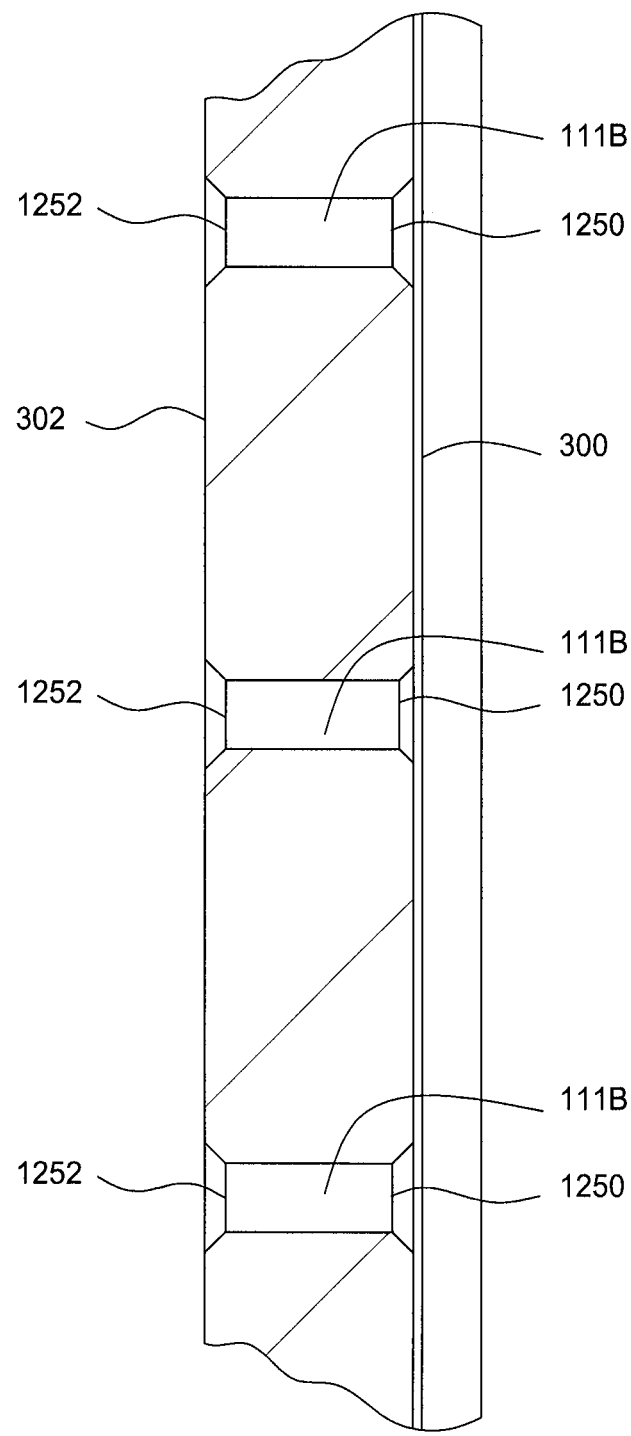

FIGS. 11 and 12A-12J are top plan views illustrating examples of the susceptor 3A and 3B, respectively, according to two embodiments of the present disclosure. As shown in the drawings, susceptors 3A and 3B are provided respectively with lift-pin through-holes 110A and 110B(1)-110B(3) through which lift pins 123 (see FIG. 13) pass. As shown in FIG. 12A, plural through-holes 111B may be formed. A problem may occur in some cases where gas may become trapped between the substrate W and the susceptor 3B. If left trapped, the trapped gas may change the thermal transfer characteristics between the susceptor 3B and the substrate W causing observable non-uniformity in the epitaxial layer being formed on the substrate W. The trapped gas may be released via the through-holes 111B when the substrate W is placed on the susceptor 3B and the substrate W undergoes minor sliding in a horizontal direction. When the susceptor 3B including the through-holes 111B is used, the film thickness uniformity distribution or resistivity distribution upon the substrate W is superior to the case where the susceptor 3A is used. This superiority appears to occur when diameters of the through-holes 111B become smaller and a quantity of the through-holes 111B becomes larger. It is believed that having a density of the through-holes 111B of at least about 5.0 through-holes 111B per square centimeter, and for example more than about 5.1 through-holes 111B per square centimeter, is associated with the superior uniformity. It is preferable that the opening ratio is more than four (4) percent and it is more preferable that the through-holes 111B be formed around the concave portion 3Ba of the susceptor as well as in the non-concave portion 3Bb. In one embodiment, the through-holes 111B may have a diameter of about 1 mm. In the embodiment shown in FIGS. 12E-12H, the through-holes 111B may be arranged in a staggered pattern. A staggered pattern means that a first group of through-holes 111B aligned on a first common radius are not radially aligned (essentially) with a through-hole 111B that is part of a second group of through-holes 111B aligned on a second common radius, wherein there are no holes aligned on a common radius that is between the common radii of the first and second groups of holes. In this embodiment, the through-holes 111B may have a density of at least 5.0 through-holes 111B per square centimeter, such as at least 5.1 through-holes 111B per square centimeter or at least 5.2 through-holes 111B per square centimeter. As shown in FIG. 12H, the through-holes 111B may include one or both of a first chamfer 1250 and a second chamfer 1252. The first chamfer 1250 is positioned at the top surface 300 of the susceptor 3B. The second chamfer 1252 is positioned at the bottom surface 302 of the susceptor 3B. The chamfers 1250, 1252 aid in strengthening the susceptor 3B by preventing crack formations.

Figures 12I, 12J:
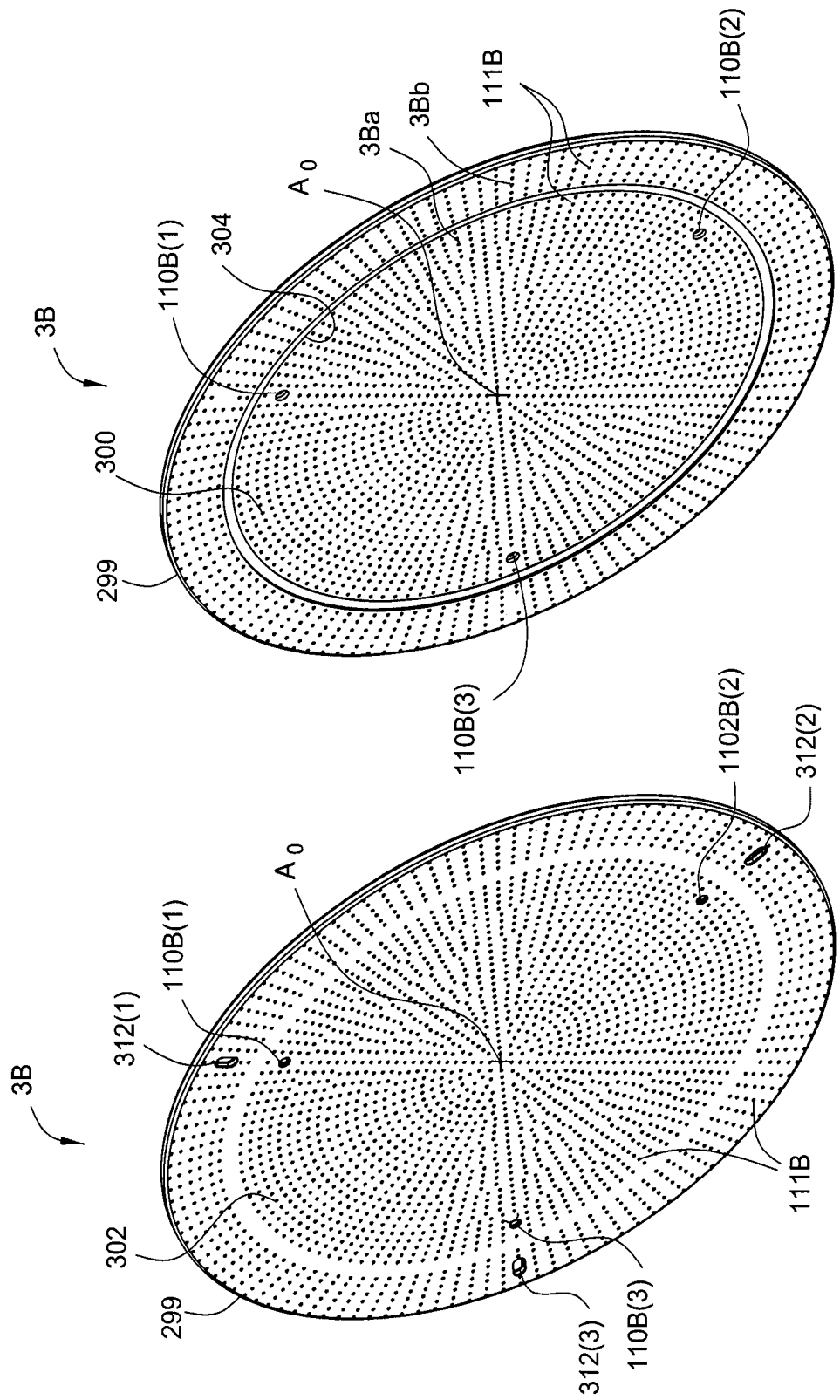

In the embodiment shown in FIGS. 12I-12J the through-holes 111B may be arranged in a radially aligned pattern. In this embodiment, the through-holes 111B may have a density of at least 5.0 through-holes 111$b$ per square centimeter, such as at least 5.2 through-holes per square centimeter or at least 5.1 through-holes 111B per square centimeter. The higher hole density improves substrate backside purge gas flow uniformity and substrate backside outgas flow away from the substrate. This aids in reducing substrate backside defects. The higher hole density also reduces side wall coating by evenly distributing the purge gas to ceiling portion 5.

With continued reference to the susceptor 3B of FIGS. 12A-12J, the susceptor 3B includes an annular body 299 having a top surface 300 and a bottom surface 302 opposite the top surface 300. The annular body 299 may extend from the center axis $A_0$ to an outer radius $R_0$ for a distance in a range from one-hundred (100) to one-hundred fifty (150) millimeters. The susceptor 3B may be integrally formed and comprise a strong and temperature resistant material, for example, carbon graphite. In one embodiment, the susceptor 3B may also include a silicon carbide coating. The silicon carbide coating may be deposited through a chemical vapor deposition (CVD) process or through other suitable processes. In one embodiment, the silicon carbide coats the inside diameter of the through-holes 111B. The top surface 300 is configured to form an abutment with the substrate W and thereby support the substrate W. A maximum thickness of the susceptor 3B may be less than five (5) millimeters to minimize the thermal energy retention of the susceptor and thereby minimize the thermal transients between the susceptor 3B and the substrate W that may result in non-uniformity of the epitaxial layer being formed on the substrate W.

The concave portion 3Ba of the top surface 300 may be disposed at a center axis $A_0$ of the susceptor 3B and extend to an inner radius $R_1$ in a range from fifty (50) to one-hundred (100) millimeters. The susceptor non-concave portion 3Bb of the top surface 300 may be disposed along a circumference of the annular body 299 and be connected to the concave portion 3Ba with a transition portion 3Bc. The transition portion 3Bc may solely support a planar-shaped bottom of the substrate W by forming an abutment therewith and may be elevated above the concave portion 3Ba by less than 0.2 millimeters during operation of the epitaxial growth apparatus 1 (FIG. 1). The transition portion 3Bc may be free of the through-holes 111B to prevent peripheral corners associated with the through-holes 111B from contacting the substrate W and generating particulates. The transition portion 3Bc of the top surface 300 may be at an elevation at least a half a millimeter below the non-concave portion 3Bb during operation of the epitaxial growth apparatus 1 (FIG. 1) to form an annular retainment surface 304 which may prevent horizontal movement of the substrate W during rotation of the susceptor 3B during operation of the epitaxial growth apparatus 1 (FIG. 1). The retainment surface 304 may be orthogonal or substantially orthogonal to at least one of the non-concave portion 3Bb or the concave portion 3Ba of the top surface 300 of the susceptor 3B. In this manner, the substrate W may be supported by the susceptor 3B.

The substrate W is placed on the susceptor 3B and removed from the susceptor 3B using at least three (3) lift pins (not shown) of a susceptor support 6 (discussed later relative to FIGS. 13 to 16). The susceptor 3B facilitates use of the three (3) lift pins by including three (3) lift-pin through-holes 110B(1)-110B(3) which may be disposed concentrically about the center of the susceptor 3B and separated by one-hundred twenty (120) degrees. The lift-pin through-holes 110B(1)-110B(3) may be configured to allow the lift pins of the susceptor support 6 to travel through the susceptor 3B to lift and lower the substrate W from and upon the transition portion 3Bc. The lift-pin through-holes 110B(1)-110B(3) may be disposed to not extend into any of the through-holes 111B to prevent the formation of sharp corners which may cause particulates. Once lifted, the substrate W may accessible to a robot for movement into and out of the reaction chamber 2.

Figure 13:
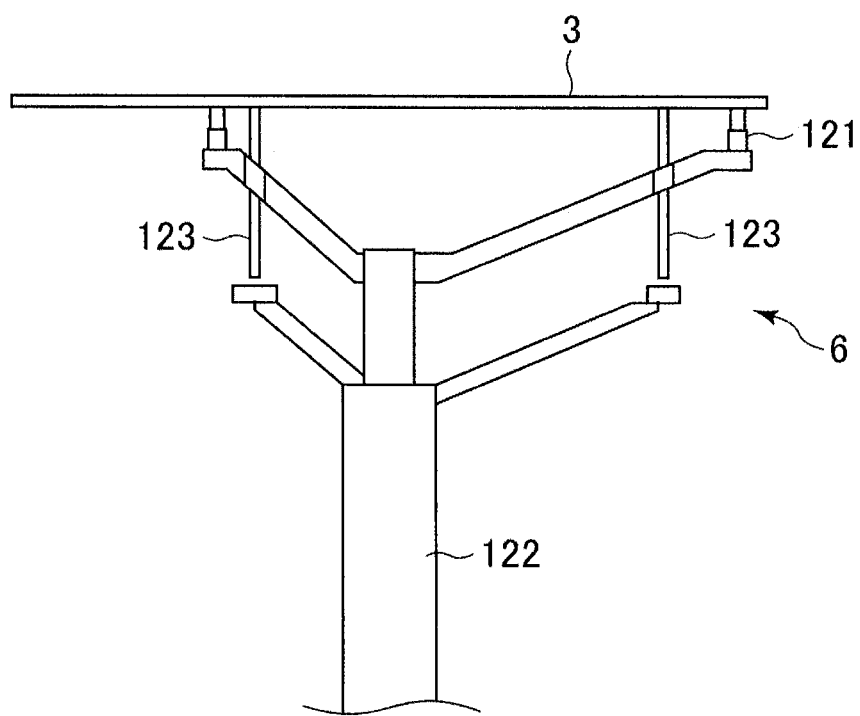
FIG. 13 is a diagram schematically illustrating the configuration of a susceptor support according to the embodiment of the present disclosure.
Figure 14:
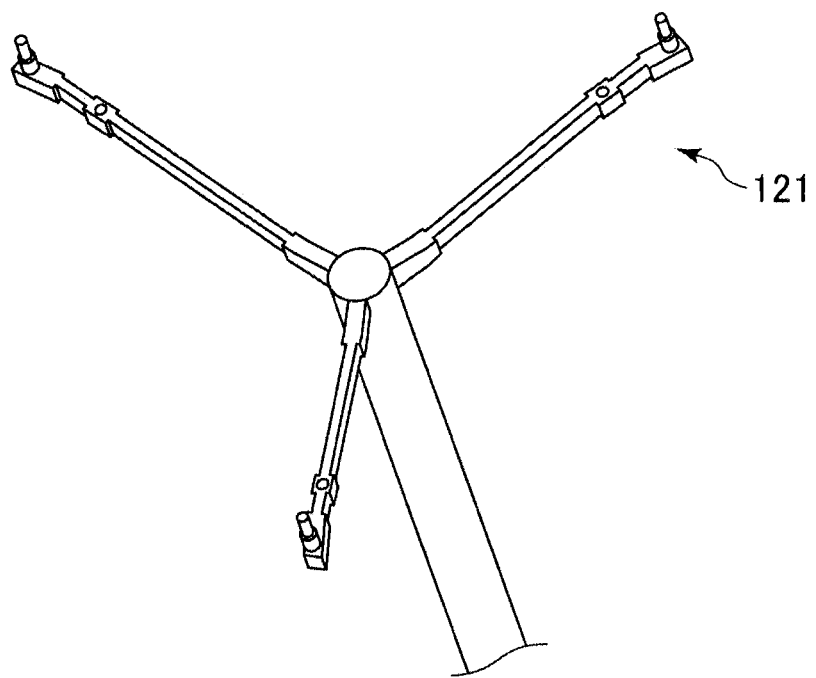
FIG. 14 is a perspective view illustrating a susceptor shaft according to the embodiment of the present disclosure.
Figure 15:
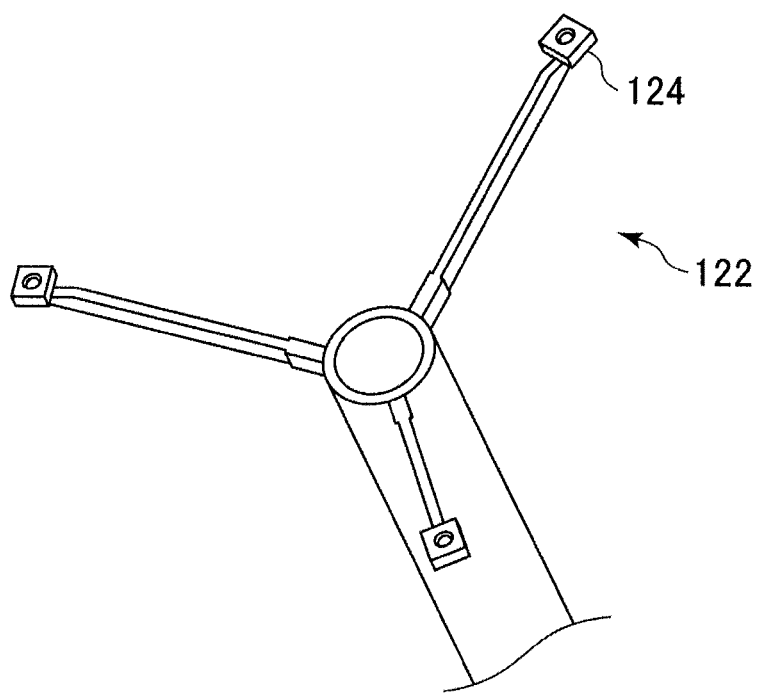
FIG. 15 is a perspective view illustrating an example of a substrate lift according to the embodiment of the present disclosure.

The susceptor 3B is also supported by three arms of the susceptor support 6 (discussed later relative to FIGS. 13 to 16). The three arms may contact and support the bottom surface 302 of the susceptor 3B at support positions 312(1)-312(3). The support positions 312(1)-312(3) may be disposed on the bottom surface 302 and directly opposite to the non-cavity portion 3Bb. The support positions 312(1)-312(3) may be free of the through-holes 111B to minimize an opportunity that particulates from the three arms may reach a top surface of the substrate W. The support positions 312(1)-312(3) may each have dimensions of at least two (2) millimeters by at least five (5) millimeters. The support positions 312(1)-312(3) may also each respectively include recessed surfaces 314(1)-314(3) which may be elevated at least 0.7 millimeters from the immediate surrounding portion of the bottom surface 302 in order to contain particulates from the three arms and prevent these particulates from reaching the substrate W. FIGS. 13 to 16 show examples of the susceptor support 6 as briefly mentioned above relative to the susceptor 3B. As shown in FIG. 13, the susceptor support 6 includes a susceptor shaft 121, a substrate lift 122, and lift pins 123. The susceptor 3 is supported by three arms of the susceptor shaft 121. Three arms of the substrate lift 122 are provided with pedestals 124 having a concave portion on which the lower end of the corresponding lift pin 123 is placed, respectively. The axis portion of the substrate lift 122 is formed in a cylindrical shape, and the axis portion of the susceptor shaft 121 can be inserted into the axis portion of the substrate lift 122.

In this embodiment, the arms in the susceptor support 6 have a thickness smaller than in the related art. Accordingly, since the influence of the susceptor support 6 can be reduced at the time of heating the substrate W on the susceptor 3 by the use of the heating means 62, it is possible to uniformize the temperature distribution of the susceptor 3. The detailed configuration and the lifting operation of the susceptor support 6 in the embodiment are the same as in the susceptor apparatus described in Pamphlet of International Publication WO2013/005481 filed by the applicant of the present disclosure. However, the susceptor apparatus described the Pamphlet of International Publication includes a single susceptor shaft (platform shaft), but the susceptor support 6 in this embodiment includes three susceptor shafts (arms) 121.

Figure 16:
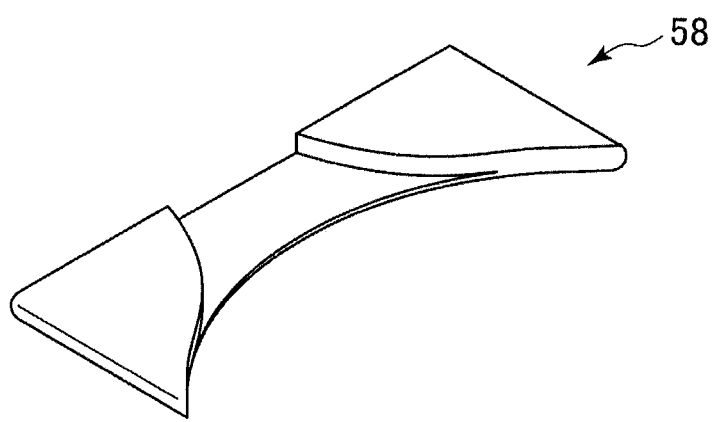
FIG. 16 is a perspective view illustrating an example of a gas discharge tube according to the embodiment of the present disclosure.

FIG. 16 is a perspective cross-sectional view illustrating an example of the gas discharge tube 58 in this embodiment. As shown in the drawing, the gas discharge tube 58 is formed so that the opening is narrowed toward the center from the reaction chamber 2 to the gas discharge portion 57. Accordingly, exhaust is rectified at the center, thereby improving the exhaust efficiency.

Figure 21:
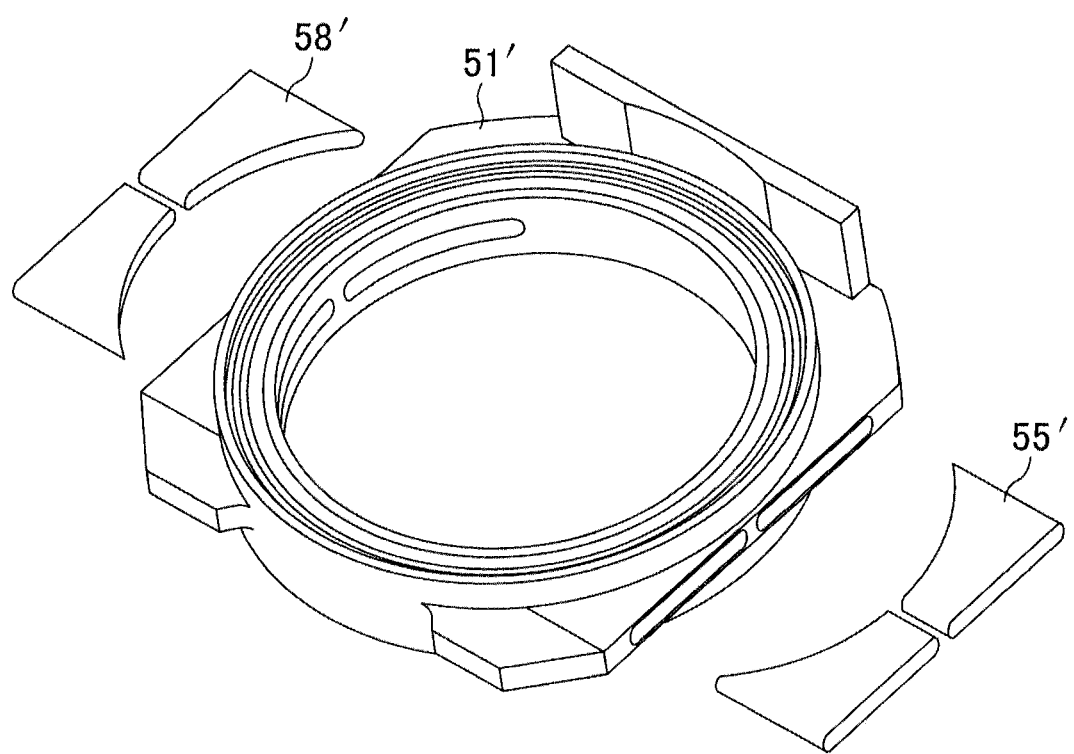
FIG. 21 is an exploded perspective view illustrating the outer configuration of a reaction chamber of the epitaxial growth apparatus according to the related art.

FIG. 21 is an exploded perspective view illustrating an annular clamping portion 51' of the outer configuration of the reaction chamber 2 in the epitaxial growth apparatus according to the related art. As shown in the drawing, comparing the gas introduction tube 55 and the gas discharge tube 58 with the gas introduction tube 55' and the gas discharge tube 58', finished portions at the central portions thereof are removed in this embodiment. Accordingly, the flow of gas affecting the film thickness distribution is smoothed.

The reactant gas flows into the lower reaction chamber part 64 when the opening ratio of the gas discharge path 42 and the purge hole 44 is excessively large, and the purge gas affects the film forming process in the reaction chamber 2 when the opening ratio is excessively small. Accordingly, the openings thereof are formed so that the opening ratios have the optimal values.

Figure 17:
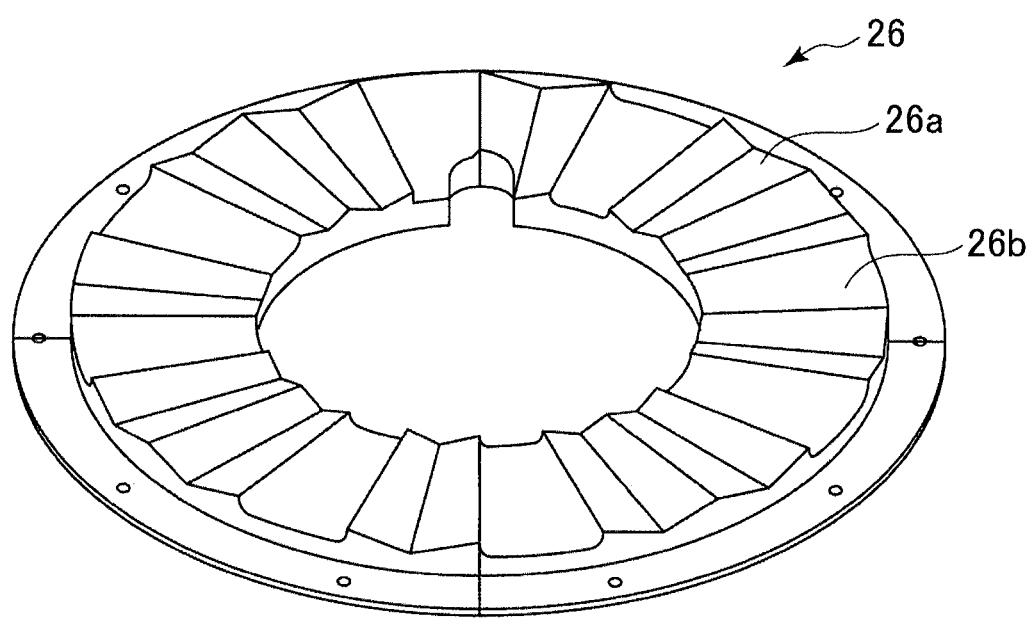
FIG. 17 is a perspective view illustrating an example of an upper reflector according to the embodiment of the present disclosure.
Figure 22:
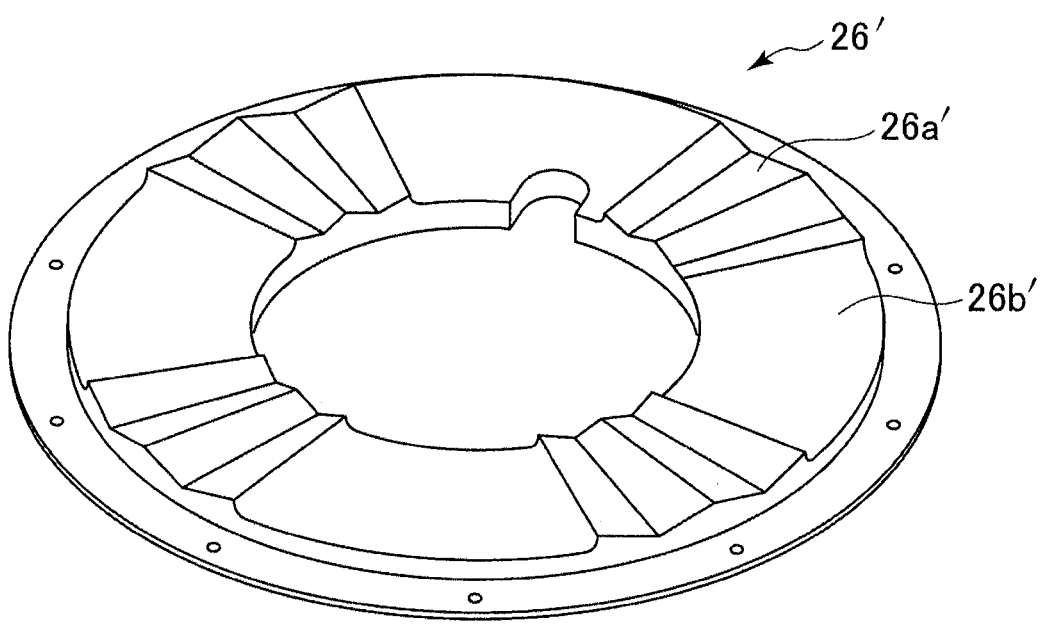
FIG. 22 is a plan view illustrating an example of an upper reflector of the epitaxial growth apparatus according to the related art.

FIG. 17 is a perspective view illustrating an example of the upper reflector 26 according to the embodiment of the present disclosure. As shown in drawing, the upper reflector 26 includes slope portions 26a reflecting heat waves from the heating means 23 to the center of the reaction chamber 2 and flat portions 26b reflecting heat waves from the heating means 23 in the vertically-falling direction. On the other hand, FIG. 22 is a perspective view illustrating an example of the upper reflector 26' in the epitaxial growth apparatus according to the related art. As shown in the drawing, the upper reflector 26' in the related art includes slope portions 26a' and flat portions 26b', but is different from the upper reflector 26 according to the embodiment of the present disclosure in the arrangement of the slope portions 26a. Specifically, the upper reflector 26 according to the embodiment of the present disclosure has an arrangement in which a slope portion is added to the center of a flat portion 26b' of the upper reflector 26' in the related art. In this way, by arranging the slope portions 26a and the flat portions 26b so that the area ratio of the slope portions 26a and the flat portions 26b is a predetermined ratio and the distribution of the slope portions 26a and the flat portions 26b is not biased, the uniformization of the temperature distribution of the substrate W is achieved.

Figure 18:
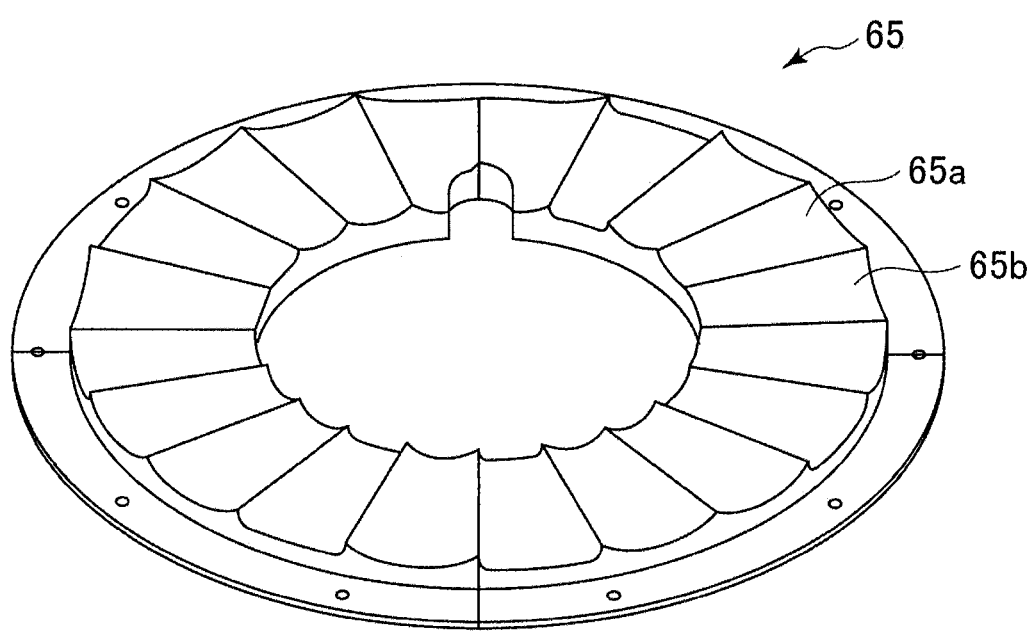
FIG. 18 is a plan view illustrating an example of a lower reflector according to the embodiment of the present disclosure.
Figure 23:
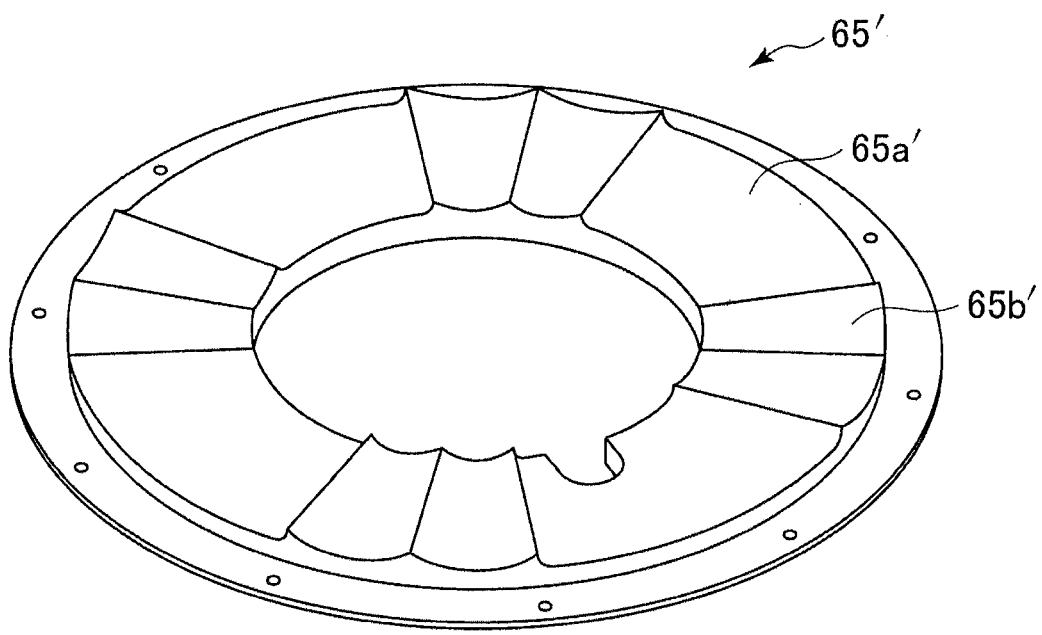
FIG. 23 is a plan view illustrating an example of a lower reflector of the epitaxial growth apparatus according to the related art.

FIG. 18 is a perspective view illustrating an example of the lower reflector 65 according to the embodiment of the present disclosure. FIG. 23 is a perspective view illustrating an example of the lower reflector 65' in the epitaxial growth apparatus according to the related art. Similarly to the upper reflector 26, the lower reflector 65 includes slope portions 65a reflecting heat waves from the heating means 62 to the center of the reaction chamber 2 and flat portions 65b reflecting heat waves from the heating means 62 in the vertically-rising direction, and has an arrangement in which a slope portion 65a' is added to the center of a flat portion 65b' of the lower reflector 65' according to the related art. In this way, by arranging the slope portions 65a and the flat portions 65b so that the area ratio of the slope portions 65a and the flat portions 65b is a predetermined ratio and the distribution of the slope portions 65a and the flat portions 65b is not biased, the uniformization of the temperature distribution of the substrate W is achieved.

In the epitaxial growth apparatus according to this embodiment, since the support 22 supports the ceiling plate 21, the distance H between the ceiling surface of the central portion of the ceiling surface of the central portion of the ceiling plate 21 facing the reaction chamber and the substrate W can be set to be less than 10 mm. Accordingly, the epitaxial growth apparatus 1 according to this embodiment can prevent the boundary layer formed by the reactant gas flowing between the ceiling plate 21 and the susceptor 3 from spreading toward the ceiling and thus the boundary layer is narrowed. Then, since the gas flow rate in the boundary layer increases, the gas density increases as a result and it is thus possible to enhance the reaction efficiency on the surface of the substrate W. Accordingly, in the epitaxial growth apparatus 1, it is possible to enhance the growth rate.

In the embodiment of the present disclosure, the distance H between the ceiling plate 21 and the substrate W is less than 10 mm, and it is preferable that the distance H between the ceiling plate 21 and the substrate W be less than 10 mm and the distance from the film formed on the substrate W to the ceiling plate 21 be equal to or more than 1 mm. By setting this range, it is possible to smooth the gas flow of the reactant gas while forming the boundary layer.

That is, in the reaction chamber 2 of this embodiment, by setting the distance between the substrate W and the ceiling plate 21 to be smaller than that in the related art (about 20 mm in the related art), it is possible to narrow the boundary layer to enhance the reaction efficiency on the surface of the substrate and thus to raise the growth rate.

EXAMPLES

The disclosure will be described below in detail with reference to examples.

Example 1

Epitaxial growth was carried out under the following growth conditions by the use of an epitaxial growth apparatus 1A (in which the distance H between the surface the substrate W and the ceiling plate 21 is 9.27 mm) employing the susceptor ring shown in FIG. 10.
  Amount of first source gas (trichlorosilane): 8.5 SLM
  Amount of purge gas (hydrogen): 15.0 SLM
  Growth time: 600.0 seconds
  Growth temperature: 1100.0° C.
  Rotation speed: 20.0 RPM

Example 2

Epitaxial growth was carried out under the same conditions as in Example 1, except that the amount of the first source gas was changed to 13.5 SLM.

Example 3

Epitaxial growth was carried out under the same conditions as in Example 1, except that the amount of the first source gas was changed to 17.0 SLM.

Comparative Example 1

Epitaxial growth was carried out under the same conditions as in Example 1 using an epitaxial growth apparatus (in which the distance H between the surface of a substrate W and the ceiling plate 21 was 20 mm, there was no groove 75, and the susceptor ring was formed of a single member) according to the related art, except the rotation speed was changed to 35.0 RPM.

Comparative Example 2

Epitaxial growth was carried out under the same conditions as in Example 2 using an epitaxial growth apparatus (in which the distance H between the surface of a substrate W and the ceiling plate 21 was 20 mm, there was no groove 75, and the susceptor ring was formed of a single member) according to the related art, except the rotation speed was changed to 35.0 RPM.

Comparative Example 3

Epitaxial growth was carried out under the same conditions as in Example 3 using an epitaxial growth apparatus (in which the distance H between the surface of a substrate W and the ceiling plate 21 was 20 mm, there was no groove 75, and the susceptor ring was formed of a single member) according to the related art, except the rotation speed was changed to 35.0 RPM.

The film growth rate in the examples and the comparative examples was detected. The relationship between the detected growth rates and the first source gas is shown in FIG. 19.

Figure 19:
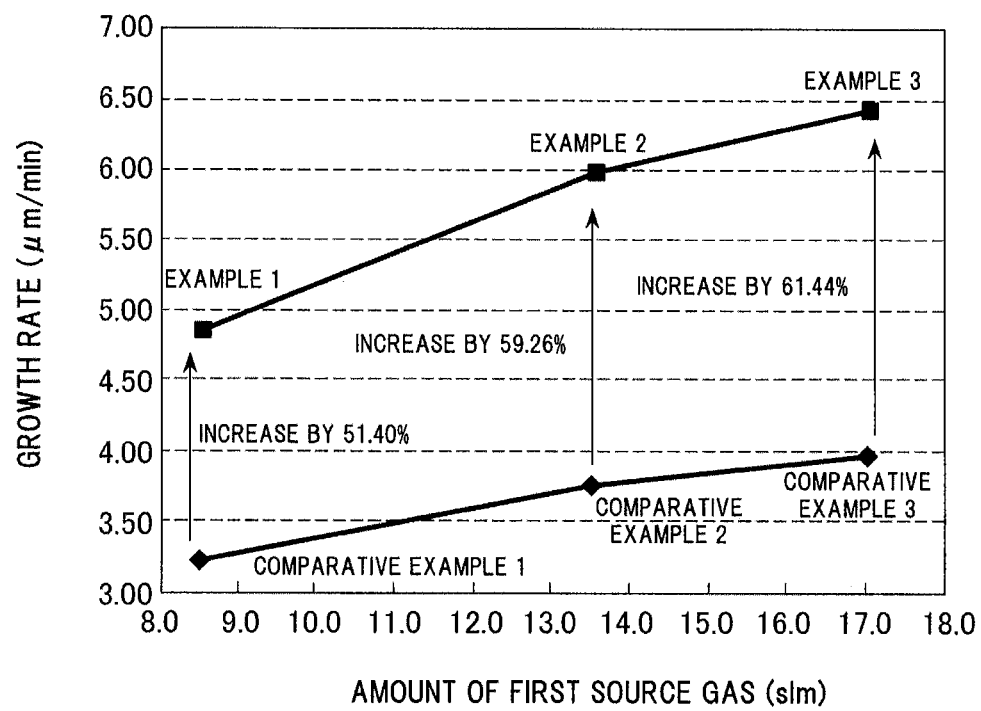
FIG. 19 is a graph illustrating results of examples and comparative examples.
Figure 20A:
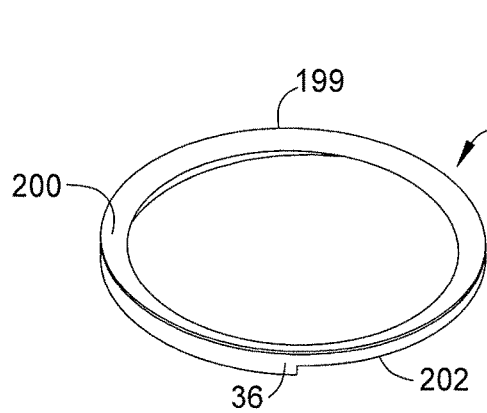
FIGS. 20A through 20F are a top perspective view, a bottom perspective view, a bottom view, a left side view, and a left cross-sectional view of the upper side wall of FIG. 1.
Figure 20B:
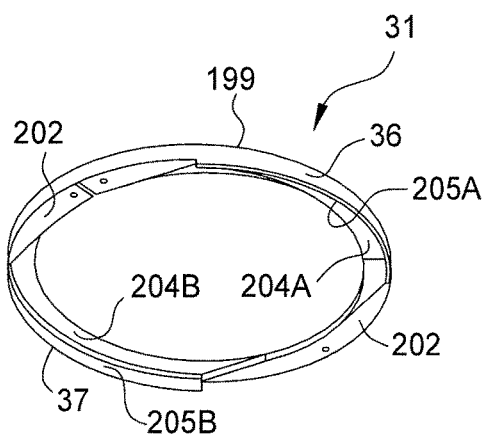
Figure 20C:
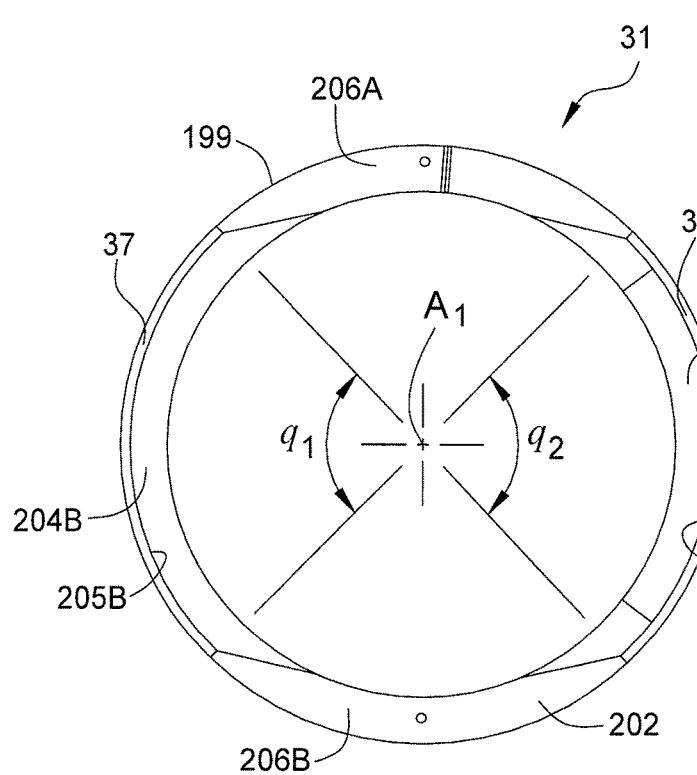
Figures 20D, 20E:
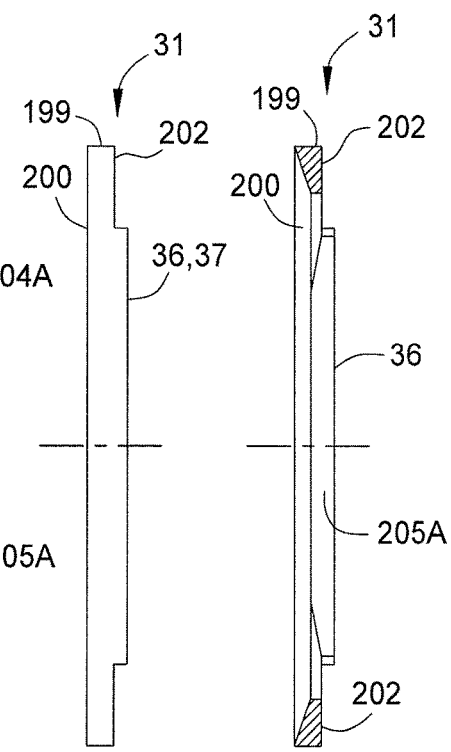
Figure 20F:
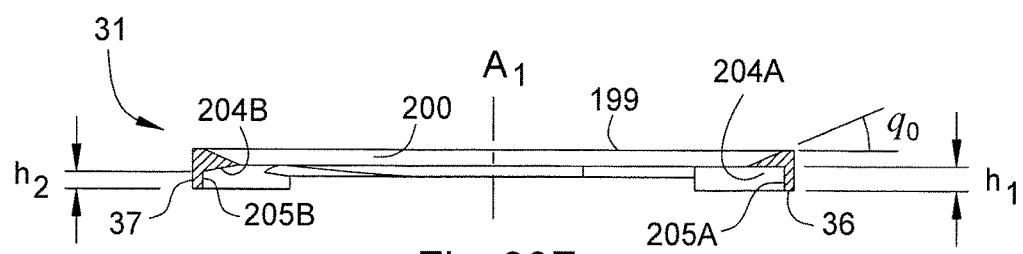

As shown in FIG. 19, by employing the epitaxial growth apparatus 1A according to the embodiment of the present disclosure, the growth rate was improved by 50% and the improvement of the growth rate increased when the amount of the first source gas increased. Therefore, the growth rate was enhanced by using the epitaxial growth apparatus according to this embodiment.

What is claimed is:

1. An upper side wall for an epitaxial growth apparatus, the upper side wall including a body, comprising:
  an upper surface including an annular shape configured to form an abutment with a ceiling plate, wherein the annular shape is disposed about a center axis;
  a bottom surface including abutment surfaces and a first flow guiding surfaces and a second flow guiding surface, the abutment surfaces are configured to form an abutment with a lower side wall supporting the upper side wall, and the first flow guiding surface and the second flow guiding surface are configured to direct precursor gases to and from a substrate;
  first and second convex portions each extending from the bottom surface, wherein the first flow guiding surface and the second flow guiding surface are disposed between the first and the second convex portions,
  a cross-sectional profile of the first convex portion differs from a cross-sectional profile of the second convex portion;
  a first inner surface of the first convex portion having a first height, the first inner surface forms a first angular length with the first flow guiding surface; and
  a second inner surface of the second convex portion having a second height, the second inner surface forms a second angular length with the second flow guiding surface, wherein the first height is less than the second height, and the first angular length is greater than the second angular length.

2. The upper side wall of claim 1, wherein the each of the first and the second convex portions are arranged circumferentially about the center axis along respective first and second angular lengths.

3. The upper side wall of claim 2, wherein the first and the second angular lengths are in a range from seventy-five (75) degrees to one-hundred ten (110) degrees.

4. The upper side wall of claim 3, wherein the first and the second angular lengths are different.

5. The upper side wall of claim 1, wherein the first and the second convex portions are separated from each other by the abutment surfaces.

6. The upper side wall of claim 1, wherein the abutment surfaces are disposed orthogonal or substantially orthogonal to the center axis.

7. The upper side wall of claim 1, wherein the body is integral.

8. The upper side wall of claim 1, wherein the body comprises quartz.

9. The upper side wall of claim 1, wherein the first inner surface and the second inner surface face each other and are disposed equidistant to the center axis.

10. The upper side wall of claim 1, wherein at least one of the first or second flow guiding surfaces is disposed orthogonal to the center axis.

11. The upper side wall of claim 1, wherein the upper surface is angled at least eighteen (18) degrees relative to a direction normal to the center axis.

\* \* \* \* \*